US007701724B2

(12) United States Patent
Tanaka et al.

(10) Patent No.: US 7,701,724 B2
(45) Date of Patent: Apr. 20, 2010

(54) SHIELD STRUCTURE FOR INFORMATION TECHNOLOGY EQUIPMENTS

(75) Inventors: Yoshiro Tanaka, Kawasaki (JP); Yoshiaki Hiratsuka, Kawasaki (JP); Yosuke Konaka, Kawasaki (JP); Takayuki Niiyama, Kawasaki (JP); Daisuke Seki, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 716 days.

(21) Appl. No.: 11/526,099

(22) Filed: Sep. 25, 2006

(65) Prior Publication Data

US 2007/0197092 A1 Aug. 23, 2007

(30) Foreign Application Priority Data

Feb. 21, 2006 (JP) ............................ 2006-044345

(51) Int. Cl.
*H05K 5/00* (2006.01)

(52) U.S. Cl. ........................ 361/752; 361/800; 361/816

(58) Field of Classification Search ......... 361/800–802, 361/818, 816, 600, 752, 790, 797, 799, 814, 361/720, 736, 748, 794; 174/35 R, 51
See application file for complete search history.

(56) References Cited

U.S. PATENT DOCUMENTS 5,191,544 A 3/1993 Benck et al. ................ 364/708
5,596,487 A * 1/1997 Castaneda et al. ........... 361/814
5,724,234 A 3/1998 Phelps ........................ 361/816
6,049,468 A * 4/2000 Learmonth .................. 361/816
6,115,243 A * 9/2000 Horii ..................... 361/679.09
6,157,538 A * 12/2000 Ali et al. ...................... 361/704
6,469,912 B1 * 10/2002 Chuang ...................... 361/816
6,525,516 B2 * 2/2003 Schultz et al. .............. 323/282

FOREIGN PATENT DOCUMENTS

| | | | |
|---|---|---|---|
| CN | 1060733 | A | 4/1992 |
| CN | 1217132 | A | 5/1999 |
| CN | 2509631 | Y | 9/2002 |
| JP | 2000-148031 | A | 5/2000 |
| JP | 2000-151132 | | 5/2000 |
| TW | 455056 | | 9/2001 |
| TW | M269707 | | 7/2005 |
| TW | M255652 | | 11/2005 |

OTHER PUBLICATIONS

Chinese Office Action dated Jun. 6, 2008 issued in the corresponding Chinese patent application No. 200610135648.5 with English translation.
Office Action dated Sep. 17, 2008 corresponding to German patent application No. 10 2006 049 567.5 w/English translation.
Office Action dated Aug. 28, 2009 issued in corresponding Taiwanese patent application with English translation.

* cited by examiner

*Primary Examiner*—Hung S Bui
(74) *Attorney, Agent, or Firm*—Fujitsu Patent Center

(57) ABSTRACT

A shield structure for information technology equipments includes an opening part provided in a portion of the shield structure and a lid covering the opening part. A signal ground line is provided on a printed circuit board accommodated in the enclosure. An electric connection material extends between the lid and the signal ground line of the printed circuit board and has at least a surface formed by an electrically conductive material. The electric connection material is in contact with the signal ground line of the printed circuit board.

16 Claims, 24 Drawing Sheets

SHIELD STRUCTURE FOR INFORMATION TECHNOLOGY EQUIPMENTS

BACKGROUND OF THE INVENTION

1. Field of the Invention

The present invention generally relates to information technology equipments and, more particularly, to a shield structure for information technology equipments, such as a notebook-type personal computer, provided with an opening for replacing a memory module.

2. Description of the Related Art

In recent years, it has become indispensable to take countermeasures against electromagnetic wave interference (EMI) or countermeasures against electrostatic discharge (ESD) with respect to information technology equipments such as a desktop-type personal computer (desktop PC), a notebook-type personal computer (note PC), a printer, a facsimile, etc. In EMC, especially, regulation for electromagnetic interference (EMI) has been progressed, and each country independently regulates its own standard or specification. Manufacturers of information technology equipments cannot sell or export their products unless they clear standards with respect to the EMI regulations. As standards with respect to the EMI regulations, there are, for example, Agreement of VCCI (Voluntary Control Council for Interference by Information Technology Equipment) in Japan, and the FCC rules and regulations in the United States.

As an international standard used as the basis of the rules regarding EMI regulations, there is a specification which is set by International Special Committee on Radio Interference (CISPR). It is the present status that each country establishes a specification based on the CISPR specification. Thus, if the CISPR specification is cleared, a rule of each country is almost cleared.

It is general in a note PC, which is one of information technology equipments, to apply a metal plate or a metal sheet or apply metal-plating on a backside of an enclosure so that electromagnetic waves do not leak from inside of the enclosure. By covering an entire surface of the enclosure, the equipment can have a structure in which electromagnetic wave do not leak outside. However, it is difficult to cover an entire surface of an enclosure. Especially, an opening part is formed on an enclosure at a portion provided with a connector for connection with external equipments, and electromagnetic waves may leak through the opening part.

Accordingly, as countermeasures against EMI, it is suggested to suppress such leakage of electromagnetic waves by attaching a metal made or metal-plated lid to an opening part of a shield structure and electrically connecting a metal portion of the lid to a ground potential portion of the enclosure (for example, refer to Patent Document 1).

Patent Document 1: Japanese Laid-Open Patent No. 2000-151132

In a personal computer or the like, in order to incorporate an expansion memory module into a printed circuit board inside an enclosure, usually, an opening for taking a memory module in and out is provided to the enclosure. The opening is closed by a metal made or metal-plated lid. However, it is difficult to completely cover a mating portion between a rim of the opening and an edge of the lid, and, thus, the EMI requirements may not be cleared due to leakage of electromagnetic waves from the mating portion.

Especially, in many cases in a note PC, a so-called butterfly type connection structure, which connects two memories to a connector part face-to-face, is used. According to the butterfly type connection structure, signal lines to the memories extend between the two memories. Since exchange of signals is performed frequently through the signal lines during operation of a CPU, the signal lines are source of generating electromagnetic waves.

Accordingly, if the butterfly type connection structure is used as an expandable and replaceable memory connection structure, there is a problem in that the EMI requirements cannot be cleared since an opening part of an enclosure is located near the butterfly type connection structure and leakage of electromagnetic waves through a periphery of the opening part become remarkable.

Moreover, an operation clock of CPUs is increased to a high frequency more and more, and with such an increase, an electromagnetic wave generated from the signal lines to the memories becomes a high-frequency. Thus, an electromagnetic wave tends to leak even through a small gap of shield.

Conventionally, if an amount of leakage of electromagnetic waves through an opening part for memory, a plurality of electromagnetic wave absorption sheet are applied to a lid, and, besides, an electrically conductive gasket or the like for electrically connecting a peripheral part of the lid and a periphery of the opening part is provided, as countermeasures against EMI. Such countermeasures against EMI requires costs of parts such as an electromagnetic wave absorption sheet and electrically conductive gasket and a process cost for operations to attach such a part, and, thus, there is a problem in that an increase in a manufacturing cost of a product itself is invited.

SUMMARY OF THE INVENTION

It is a general object of the present invention to provide an improved and useful shield structure for information technology equipments in which the above-mentioned problems are eliminated.

A more specific object of the present invention is to provide a shield structure for information technology equipments, which can reduce electromagnetic waves leaking from an opening part provided for memory replacement.

In order to achieve the above-mentioned objects, there is provided according to one aspect of the present invention a shield structure for information technology equipments, comprising: a signal ground line provided on a printed circuit board accommodated in the shield structure for information technology equipments; an opening part provided in a portion of the shield structure for information technology equipments; a lid covering the opening part; and an electric connection material extending between the lid and the signal ground line of the printed circuit board and having at least a surface formed by an electrically conductive material, wherein the electric connection material is in contact with the signal ground line of the printed circuit board.

According to the present invention, a potential of the lid covering the memory opening part of the shield structure can be equal to the signal ground potential of the printed circuit board. Thereby, a shielding effect of electromagnetic wave generated in the memory module on the printed circuit board and portions in the vicinity of the memory module in the shield structure for information technology equipments can be improved, which reduces the level of interference waves leaking outside of the shield structure due to the memory module.

In the shield structure for information technology equipments according to the present invention, two connectors may be mounted on the printed circuit board close to each other so that two memory modules are connectable to the connectors, respectively, and the opening part may be provided at a position corresponding to a position where the memory modules are connected to the connectors. The signal ground line may be provided on a signal wiring formed between the two connectors, and the electric connection material extends between the two connectors. Additionally, at least one protruding tab may be formed on one side of the lid so as to be inserted into an engaging part of the shield structure for information technology equipments, the electric connection material may extend in a direction of insertion of the protruding tab, and the connectors on the printed circuit board may extend in the direction of insertion. The electric connection material may be a protruding part protruding on a backside of the lid and having at least a surface formed of an electrically conductive material. The lid may have a structure in which a metal plate is applied to an entire backside including the protruding part. Alternatively, the lid may have a structure in which conductive plating is applied onto an entire backside including the protruding part. Additionally, only a part of the protruding part of the lid may be in contact with the signal ground line.

In the shield structure for information technology equipments according to the present invention, the electric connection material may be a reinforcing material crossing the opening part of the shield structure for information technology equipments and having at least a surface formed of an electrically conductive material. The reinforcing material may extend between the two connectors, and one end of the reinforcing material may be in contact with the signal ground line on the printed circuit board. Only a part of the reinforcing material may be in contact with the signal ground line. The reinforcing material may extend between the two connectors, and an electrically conductive elastic material may be provided between the reinforcing material and the signal ground line on the printed circuit board. The electrically conductive elastic material may be an electrically conductive gasket. The electrically conductive elastic material may be a surface mount spring.

In the shield structure for information technology equipments according to the present invention, the electric connection material may be an electrically conductive material arranged between the two connectors and having at least a surface formed of an electrically conductive material, and opposite ends of the electric connection material may be in contact with a backside of the lid and the signal ground line, respectively. The electrically conductive material may be elastically deformable between the lid and the signal ground line.

In the shield structure for information technology equipments according to the present invention, the signal ground line may be an electrically conductive sheet material applied on an insulation film applied on the signal wiring formed on the printed circuit board between the two connectors, and the electrically conductive sheet material may be electrically connected to a ground potential portion of the printed circuit board. The electrically conductive sheet material may be a copper sheet.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments according to the present invention.

Figure 1:
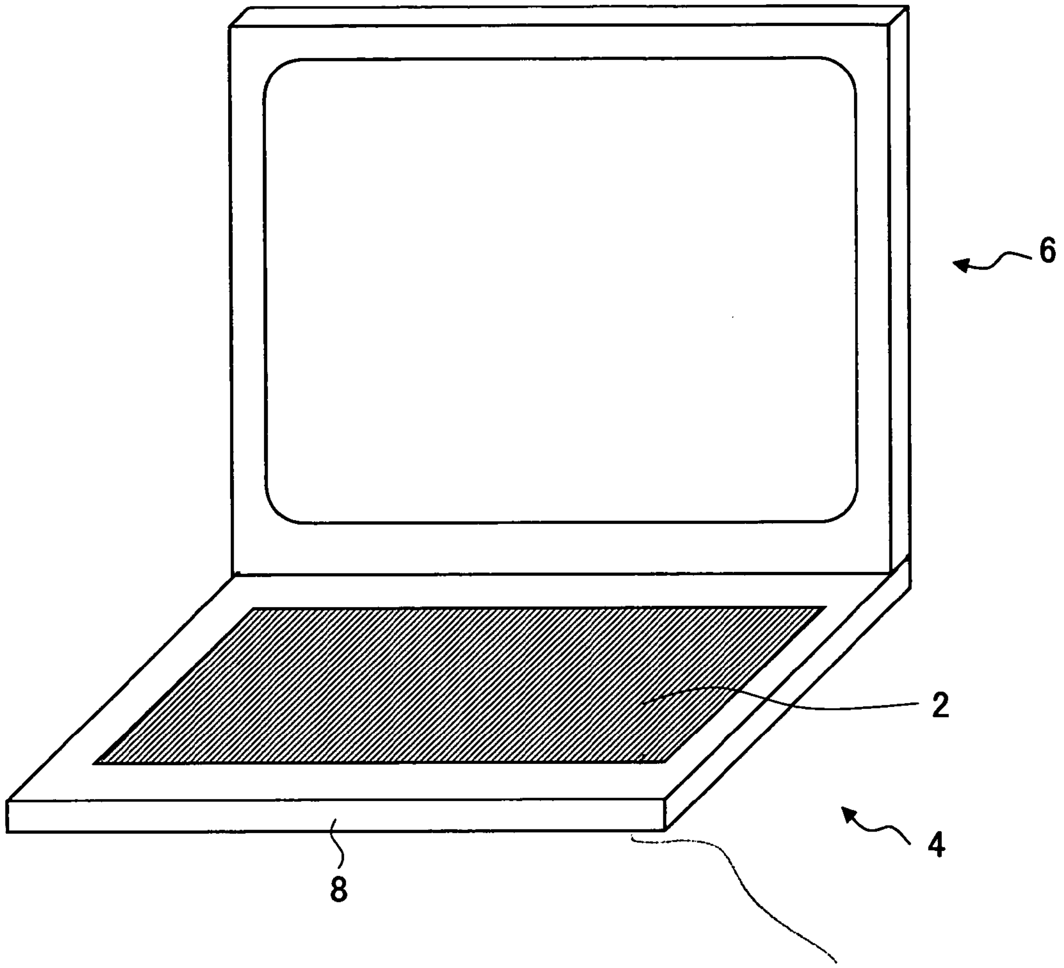
FIG. 1 is an illustrative perspective view of a note PC, which is an example of information technology equipments to which the present invention is applied.

FIG. 1 is an illustrative perspective view of a note PC, which is an example of information technology equipments to which the present invention is applied. The note PC comprises a main part 4 in which a keyboard 2 is arranged, and a display part 6 rotatable with respect to the main part 4. The main part 4 has an enclosure 8 having an upper surface on which the keyboard 2 is arranged. Accommodated in the enclosure 8 are a printed circuit board having a CPU, a storage unit, etc., mounted thereon, a storage unit such as a hard disk drive, modules and connectors for communication with external devices.

Figure 2:
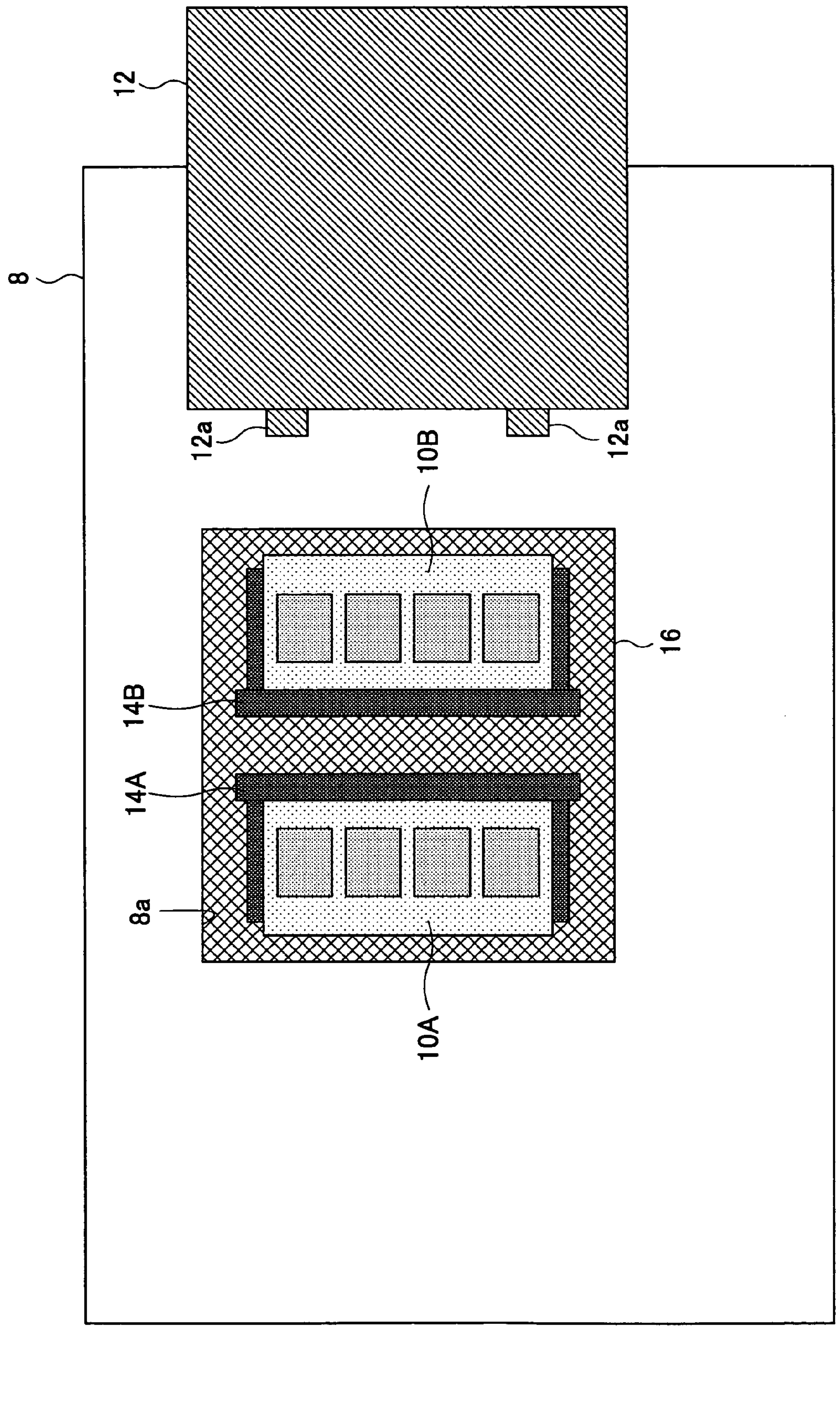
FIG. 2 is an illustrative plan view of a shield structure of the note PC shown in FIG. 1 viewed from a bottom side.

Consideration will be given to a case where two memory modules are mounted in the note PC shown in FIG. 1. FIG. 2 is an illustrative plan view of the enclosure 8 of the note PC shown in FIG. 1 viewed from a bottom side (opposite side of the keyboard 2). An opening part 8*a* is provided on the bottom side of the enclosure in a portion corresponding to the memory modules 10A, 10B so as to make the memory modules 10A, 10B replaceable. A removable lid 12 is attached to the opening part 8*a*. In FIG. 2, the lid 12 is shown in a state where the lid 12 is removed from the opening part 8*a*. Accordingly, in FIG. 2, a state where the internal memory modules 10A, 10B are seen through the opening part 8*a* on the bottom side of the enclosure 8.

The two memory modules 10A, 10B have generally rectangular outer configuration and have the same size. Connection terminals are aligned along one side (longer side) of the rectangle of each of the memory modules 10A, 10B. Two connectors 14A, 14B as memory slots to which the memory modules 10A, 10B are connected are mounted to a printed circuit board 16, which is a printed circuit board accommodated in the enclosure 8. The two connectors 14A, 14B are arranged in a state where connecting portions are directed opposite to each other. The memory module 10A is inserted into the left connector 14A from the left side, and the memory module 10B is inserted into the right connector 14B from the right side. As mentioned above, a so-called butterfly type connection structure is used as the connection structure of the memory modules 10A, 10B.

Figure 3:
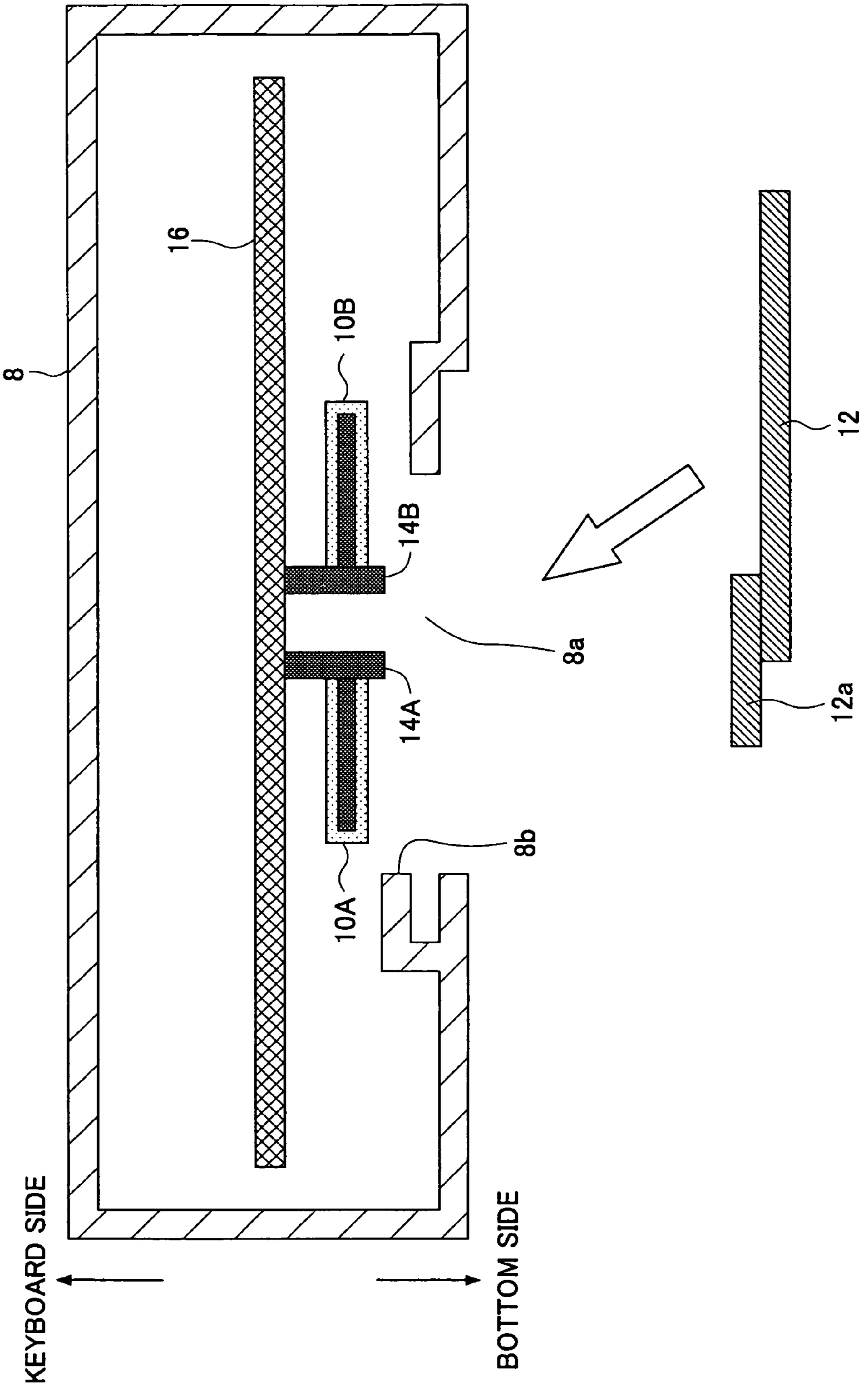
FIG. 3 is an illustration showing a positional relationship between memory modules, the shield structure and a lid.

FIG. 3 is an illustration showing a positional relationship between the memory modules 10A, 10B, the enclosure 8 and the lid 12, and a state where an interior of the enclosure 8 is seen from a side is shown. The connectors 14A, 14B are mounted on the printed circuit board 16 accommodated in the enclosure 8, and the opening part 8*a* is formed on the enclosure 8 under the memory modules 14A, 14B, and the lid 12 is attached so as to close the opening part 8*a*.

Figure 4:
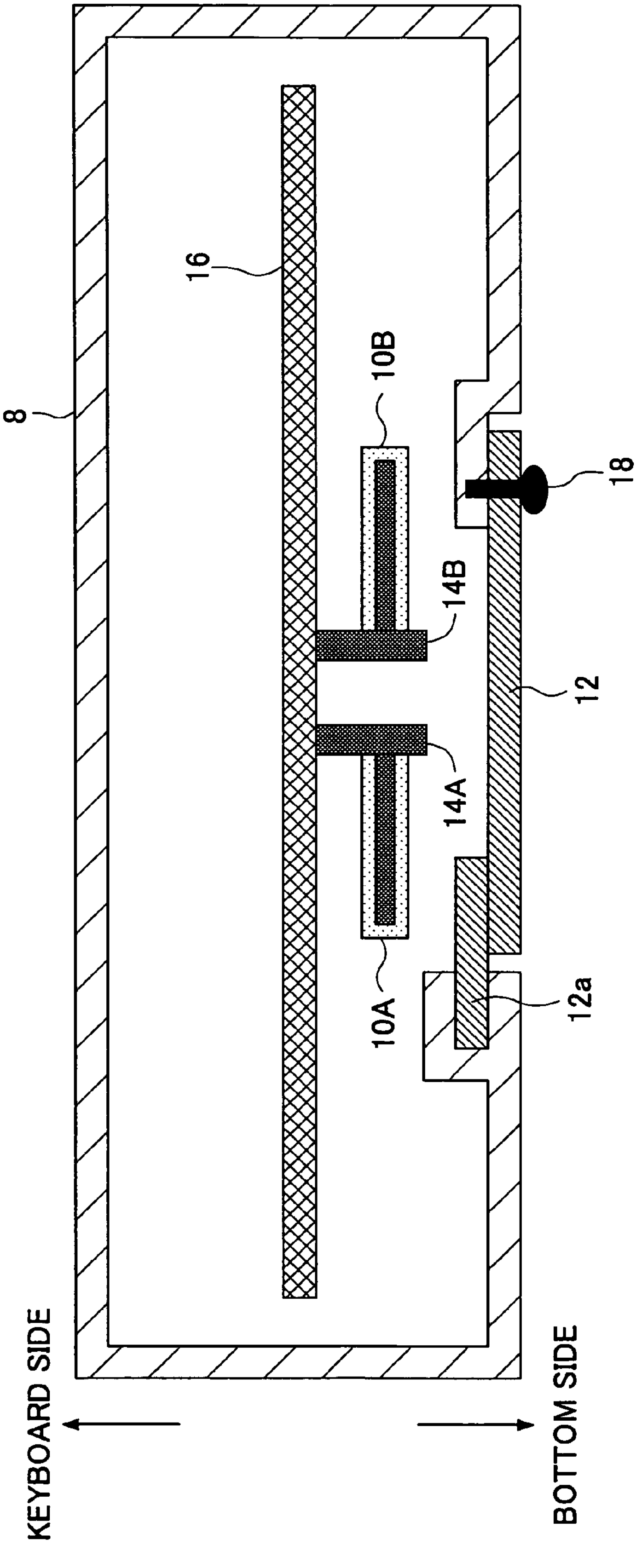
FIG. 4 is an illustration showing a state where the lid is attached to the opening part.

The lid 12 has protruding tabs 12*a* protruding on one side, and the lid 12 is attachable to the opening part 8*a* in a state where the protruding parts 12*a* are inserted into an engaging part 8*b* provided on one side of the opening part 8*a* of the shield structure 8. FIG. 4 is an illustration showing a state where the lid 12 is attached to the opening part 8*a*. The lid 12 is fixed by screws 18 in a state where the protruding parts 12*a* are inserted into engaging parts 8*b* while moving the lid 12 in a direction indicated by an arrow in FIGS. 2 and 3 so as to cover the opening part 8*a*.

A description will now be given, with reference to FIG. 5 through FIG. 10, of a shield structure of a note PC according to a first embodiment of the present invention.

Figure 5:
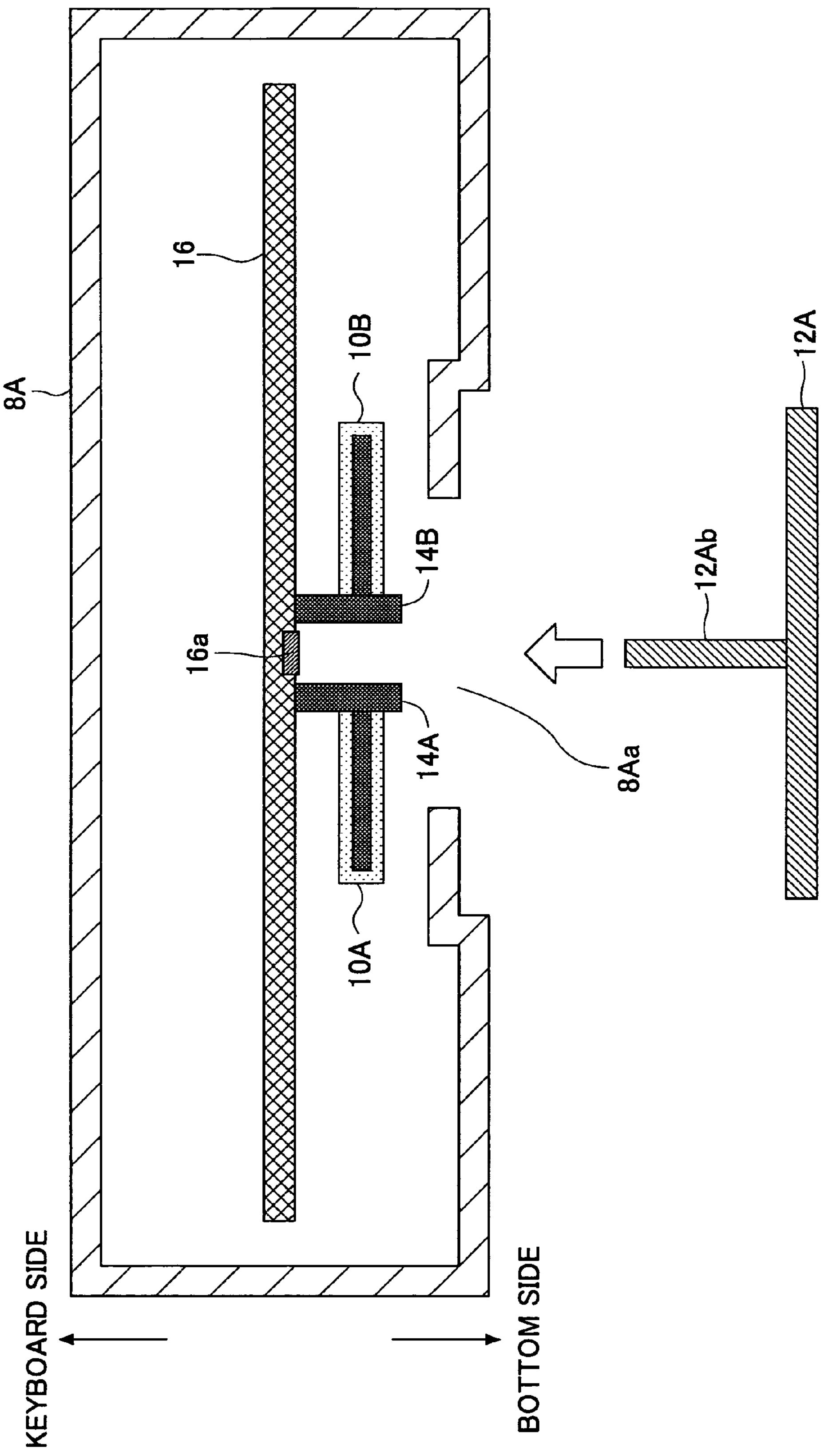
FIG. 5 is an illustrative perspective view of a housing of a note PC according to a first embodiment of the present invention.

FIG. 5 is an illustrative perspective view of the enclosure 8A of the note PC according to the first embodiment of the present invention, and a state where the lid 12A is removed is shown. In the enclosure 8A, similar to the structure shown in FIG. 2 through FIG. 4, the connectors 14A, 14B are mounted on the printed circuit board 16, and memory modules 14A, 14B are connected to the connectors 14A, 14B, respectively. An opening part 8Aa is formed in the enclosure 8A under the memory modules 10A, 10B, and a lid 12A is attached to the enclosure 8A so as to close the opening part 8Aa.

As shown in FIG. 5, protruding tabs 12Ab are formed in a central part on the backside of the lid 12A according to the present embodiment. The protruding tabs 12Ab are formed in a plate-like shape so that, when the lid 12A is attached to the opening part 8Aa, the protruding tabs 12Ab protrude into inside the enclosure 8A and interposed between the connectors 14A, 14B.

Moreover, a signal ground line (SG) 16*a* is formed on the printed circuit board 16 between the connectors 14A, 14B. The signal ground line 16*a* is connected to a ground potential portion of the printed circuit board 16, which is a printed circuit board. The signal ground line 16*a* is a metal wiring or an elongated electrically conductive material made of a copper foil or a copper plate, and a surface thereof is not insulated. As mentioned later, extreme ends of a protruding part 12Ab of the lid 12A is brought into contact with the signal ground line 16*a* on the printed circuit board 16 in a state where the lid 12A is attached to the opening part 8Aa. Accordingly, the protruding part 12Ab of the lid 12 serves as an electrical connection material as explained below.

Figure 6:
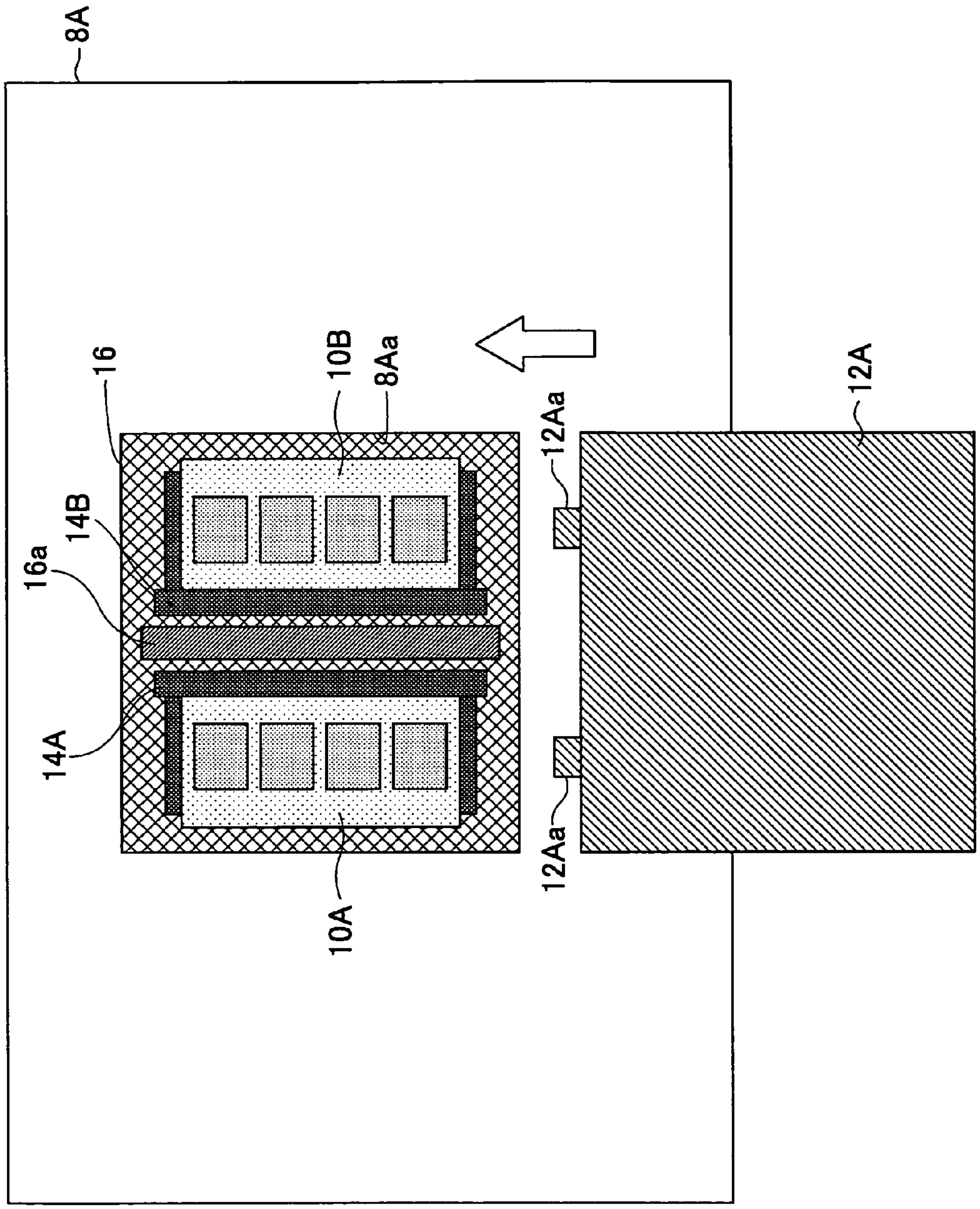
FIG. 6 is an illustrative plan view of the shield structure in FIG. 5 viewed from a bottom side.

FIG. 6 is an illustrative plan view of the enclosure 8A shown in FIG. 5 viewed from the bottom side, and a state where the lid 12A is removed is shown. As shown in FIG. 6, in the present embodiment, the lid 12A for closing the opening is configured to be attached to the opening part 8Aa while being moved in an extending direction of the connectors 14A, 14B arranged parallel to each other on the printed circuit board 16. That is, the protruding tubs 12Aa of the lid 12 are formed on one side perpendicular to the extending direction of the connectors 14A, 14B, and the direction of insertion of the protruding tubs 12Aa is aligned with the extending direction of the connectors 14A, 14B. Additionally, the plate-like protruding part 12Ab formed on the backside of the lid 12A is configured to be positioned between the connectors 14A, 14B so as to extend in the extending direction of the connectors 14A, 14B.

Figure 7:
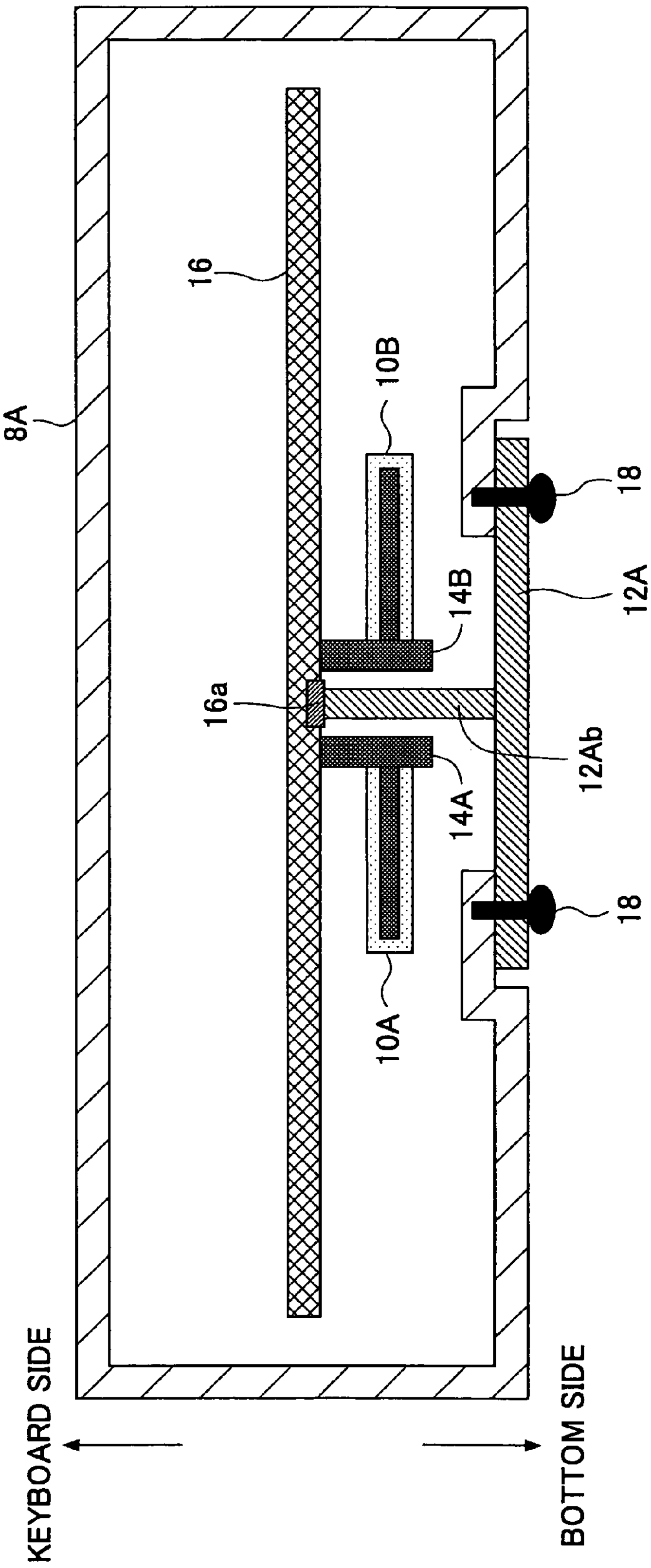
FIG. 7 is an illustrative cross-sectional view showing a state where a lid is attached to an opening part.

FIG. 7 is an illustrative cross-sectional view showing a state where the lid 12A is attached to the opening part 8Aa. The lid 12A is attached to opening part 8Aa and fixed by screws 18 to the enclosure 8A. It should be noted that although the opening part 8Aa is smaller than an area where the memory modules 10A, 10B are provided in FIG. 7, actual memory modules 10A, 10B are size that can be connected to the connectors 14A, 14B while being inserted through the opening part 8Aa. This also applies to FIG. 4 and FIG. 5 and the drawings subsequent to FIG. 7.

As shown in FIG. 7, the protruding part 12Ab of the lid 12A is inserted between the connectors 14A, 14B and the extreme end of the protruding parts 12Ab is brought into contact with the signal ground line (SG) 16A on the printed circuit board 16. As mentioned later, the backside of the lid 12A including the protruding part 12Ab is covered with metal, and the extreme end of the protruding part 12Ab is in contact with the signal ground line 16*a*, and, thereby, the entire backside of the lid 12A can be at the same potential as the printed circuit board 16. Thus, electromagnetic waves generated due to operations of the memory modules 10A, 10B are shielded, which effectively suppresses leakage of electromagnetic waves from the opening part 8Aa.

Although, conventionally, electric connection with the shield structure (a ground potential portion of the shield structure) is attempted at the periphery of the lid and the lid is caused at the shield structure ground potential (FG), a shielding effect of electromagnetic waves is improved by causing the lid 12A to be at the signal ground potential of the printed circuit board 16 in the present embodiment. Additionally, the position where the signal ground line 16*a* is provided is a position between the connectors 14A, 14B and where the signal lines to the memory modules 10A, 10B are gathered and extend. A lot of electromagnetic waves are generated from the signal lines to the memory modules. However, according to the present embodiment, since the metal-made signal ground line 16*a* made of a copper foil or a copper plate is provided directly above the signal lines to the memory modules, the electromagnetic waves can be effectively shielded.

Figure 8:
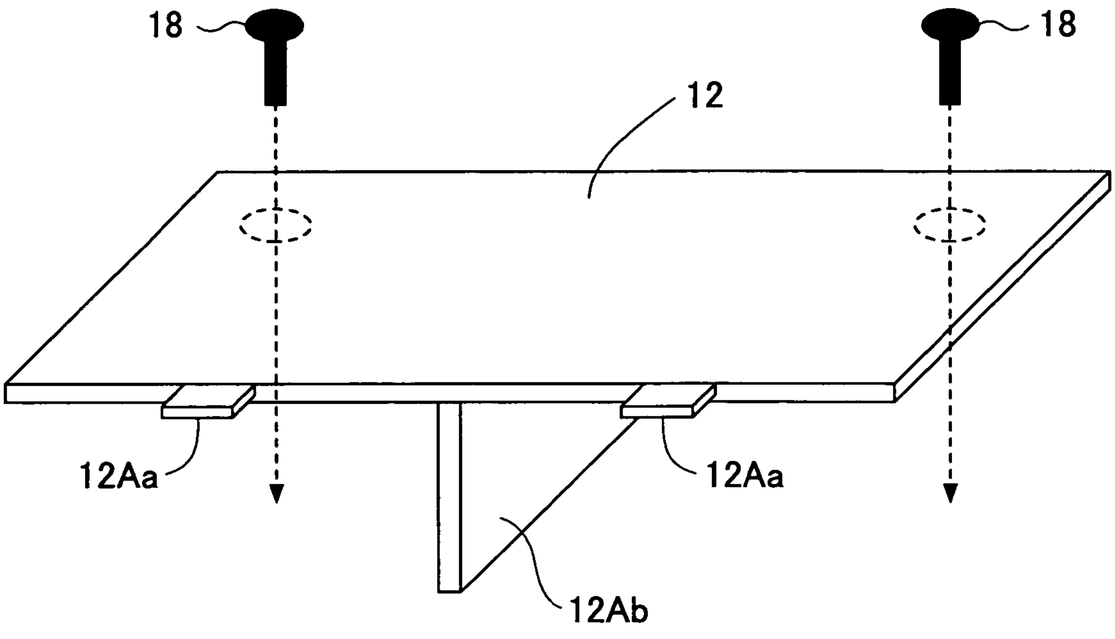
FIG. 8 is a perspective view of the lid viewed from above.
Figure 9:
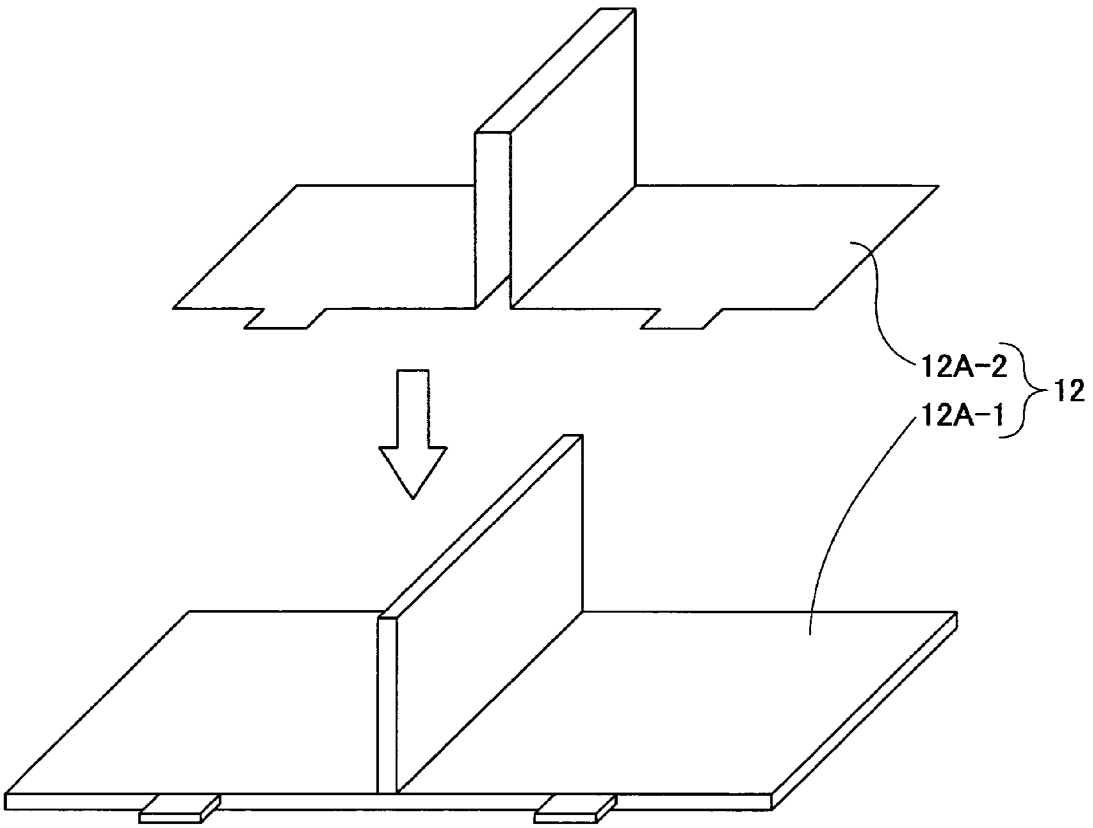
FIG. 9 is a perspective view of the lid viewed from a backside.

A description will now be given, with reference to FIG. 8 through FIG. 10, of the structure of the lid 12A. FIG. 8 is a perspective view of the lid 12A viewed from above. FIG. 9 is a perspective view of the lid 12A viewed from the backside. As shown in FIG. 8, the plate-like protruding part 12Ab is formed on the backside of the lid 12A. The protruding tabs 12Aa are provided on one side of the lid 12A. The protruding direction of the protruding tabs 12Aa is aligned with the extending direction of the plate-like protruding part 12Ab. This is to insert the protruding tabs 12Aa between the connectors 14A, 14B while simultaneously inserting the protruding tabs 12Aa into an engaging part of the enclosure 8A (corresponding to the engaging part 8*b* shown in FIG. 3). Thus, the extending direction of the connectors 10A, 10B on the printed circuit board 16 is aligned with the inserting direction of the lid 12A.

The lid 12A is made of, for example, a main part 12A-1 made of plastics and a metal-made electrically conductive part 12A-2, as shown in the FIG. 9. The electrically conductive part 12A-2 formed of metal such as a copper plate or a copper foil is configured to be the same shape as the entire backside of the lid 12A, and is applied to the main part 12A-1 by an adhesive material such as a double-faced adhesive tape. Thereby, the entire backside of lid 12A including the extreme ends of the protruding part 12Ab is covered with metal. It should be noted that metal-plating as electrically conductive plating may be applied to the entire backside of the main part 12A-1 made of plastics. Alternatively, the entire lid 12A including the protruding part 12Ab may be formed of a metal.

Figure 10:
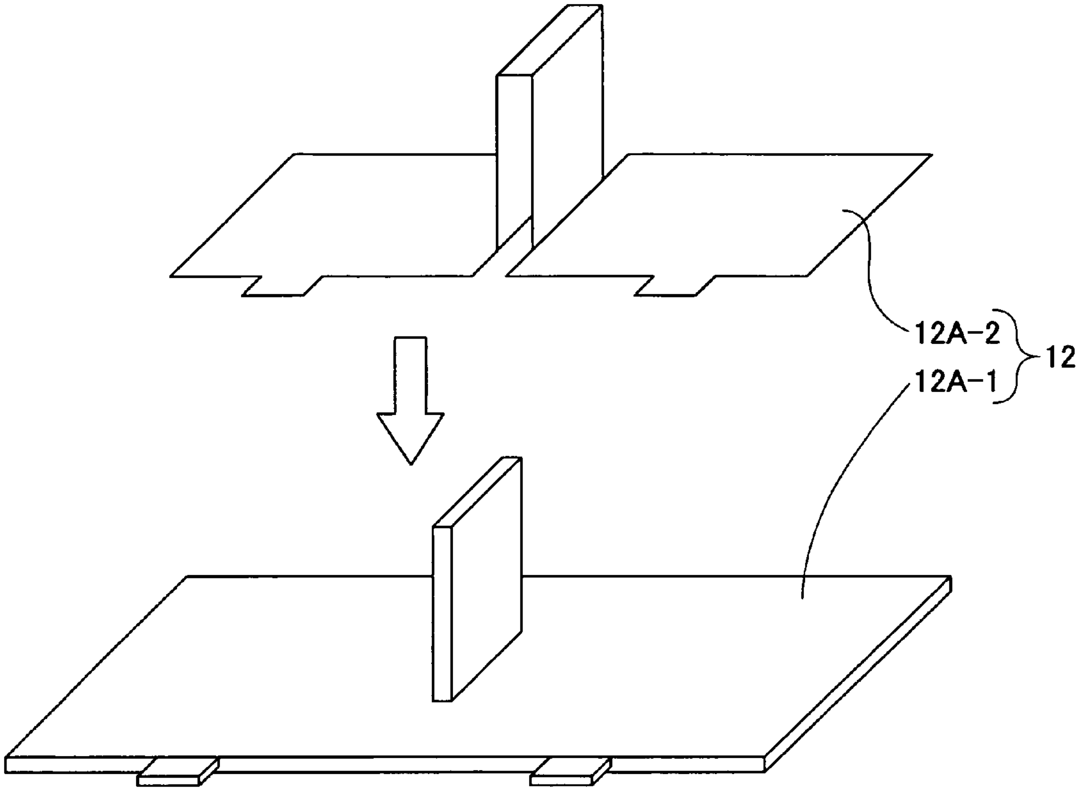
FIG. 10 is an exploded perspective view showing a variation of the lid.

FIG. 10 is an exploded perspective view showing a variation of the lid 12A. As shown in FIG. 10, there is no need to form the protruding part 12Ab of the lid 12A over the entire width of the lid 12A, and the protruding part 12Ab may be provided only in a central portion. In such a case, when the lid 12A is attached to the opening part 8Aa, a contact area between the protruding part 12Ab and the signal ground line 16*a* on the substrate 16 is small, but the effect of ground can be obtained sufficiently. Additionally, although not shown in the figure, a plurality of small protruding parts may be provided so as to be brought into contact with the signal ground line 16*a* at a plurality of positions.

Figure 11:
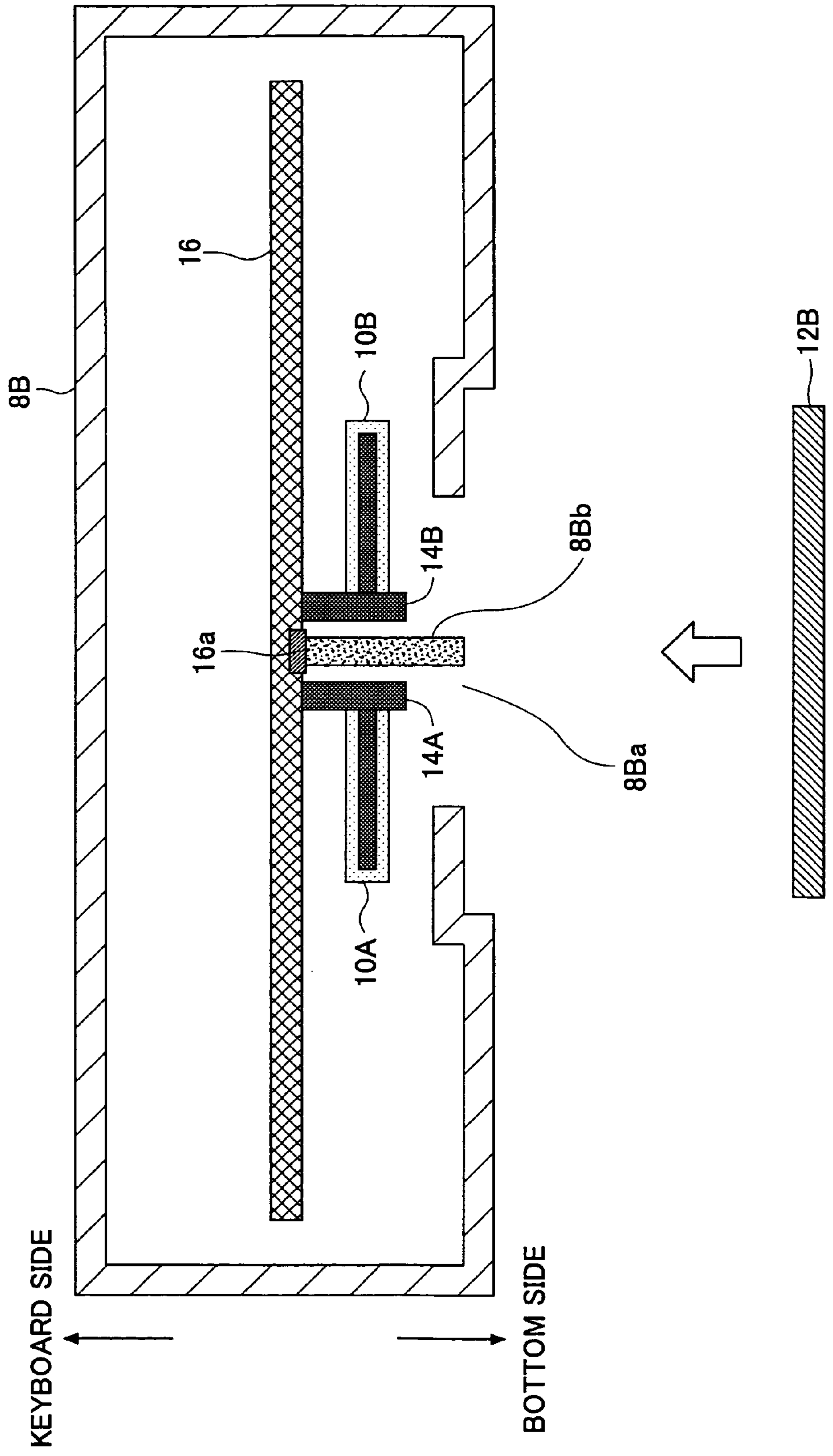
FIG. 11 is an illustrative cross-sectional view of a shield structure of a note PC according to a second embodiment of the present invention.
Figure 12:
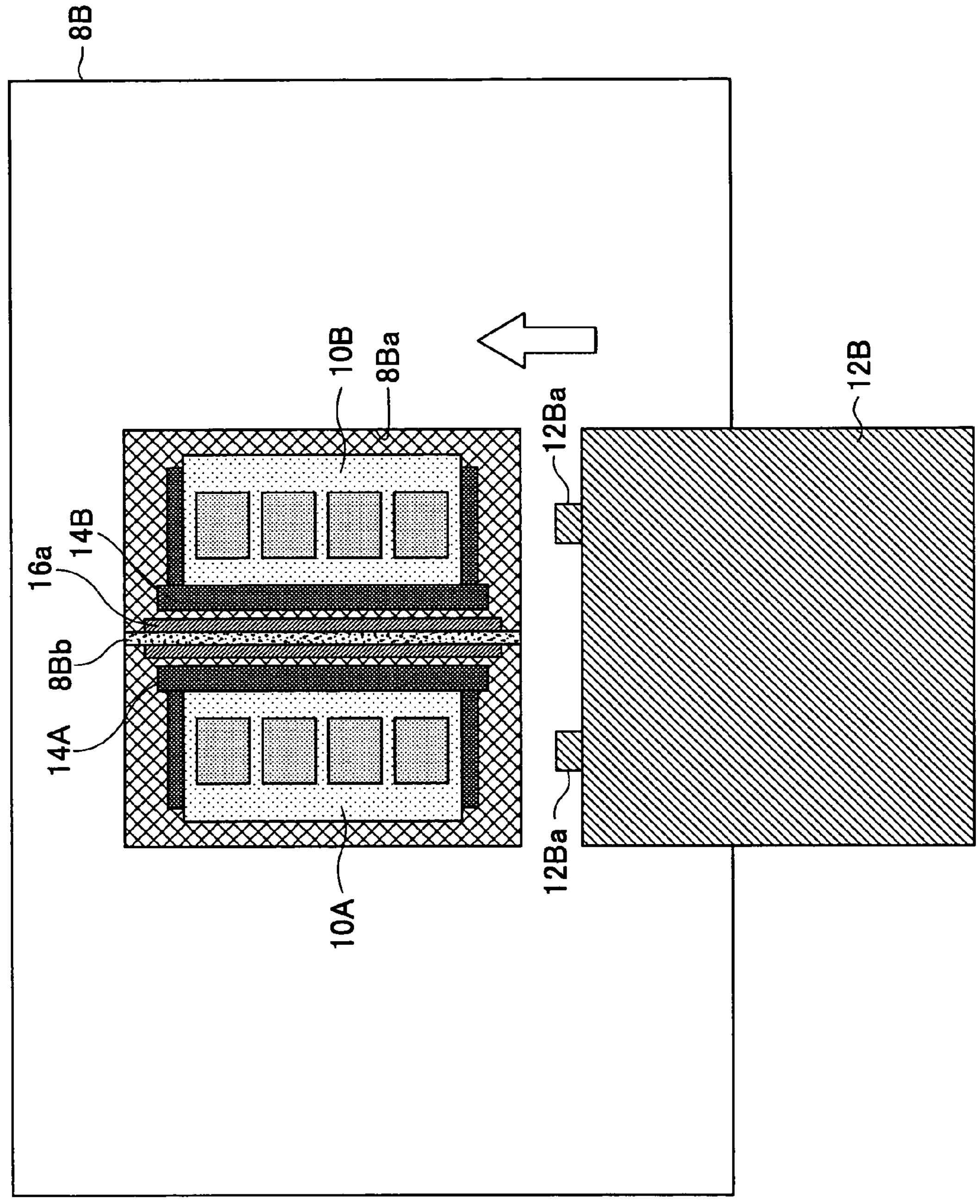
FIG. 12 is an illustrative plan view of the shield structure viewed from a bottom side.
Figure 13:
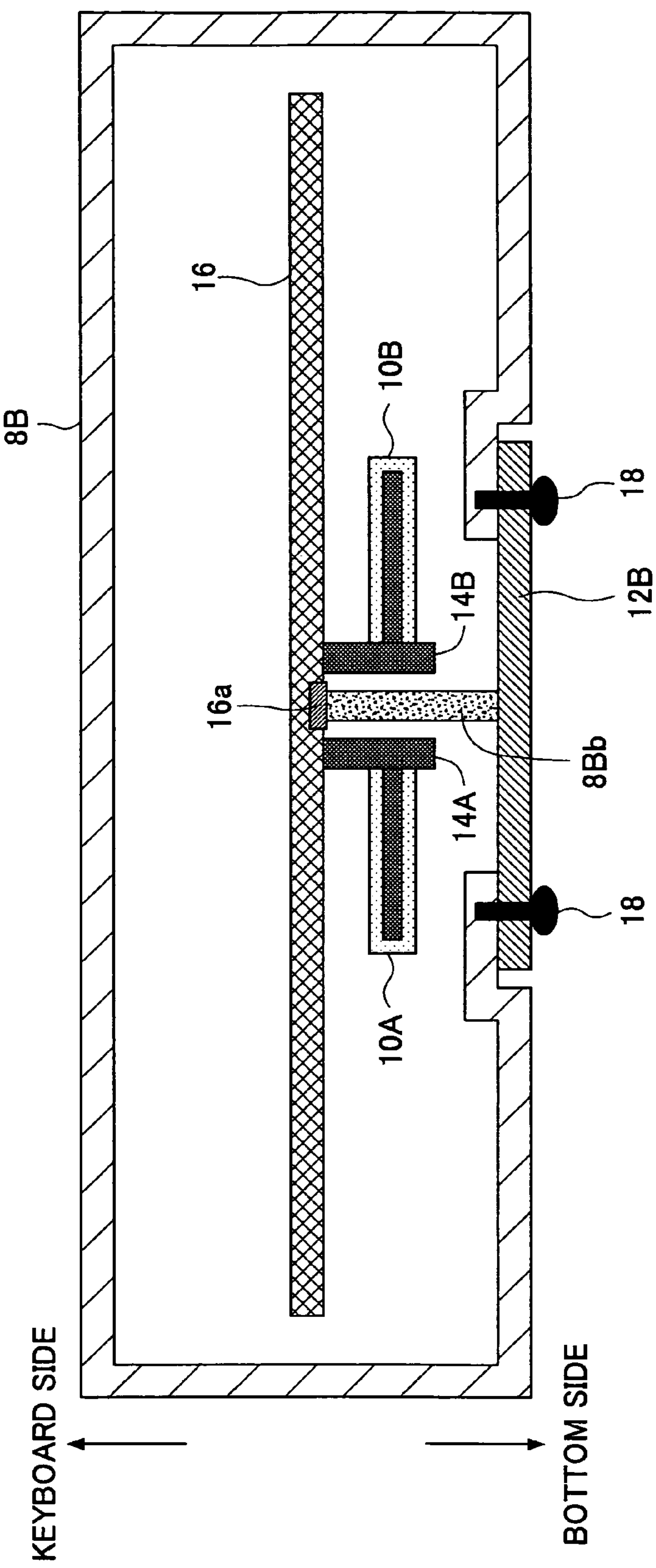
FIG. 13 is a cross-sectional view showing a state where the lid is attached to an opening part of the shield structure.

A description will now be given, with reference to FIG. 11 through FIG. 13, of a shield structure of a note PC according to a second embodiment of the present invention. In FIG. 11 through FIG. 13, parts that are the same as the parts in the above-mentioned first embodiment are given the same reference numerals.

FIG. 11 is an illustrative cross-sectional view of the shield structure 8B of the note PC according to the second embodiment of the present invention. FIG. 12 is an illustrative plan view of the shield enclosure 8B viewed from a bottom side, and a state where the lid 12B is removed is shown. FIG. 13 is a cross-sectional view showing a state where the lid 12B is attached to the opening part 8Ba of the enclosure 8B. In the present embodiment, as a part of the enclosure 8B, a rib 8Bb is provided in the center of the opening part 8Ba as a reinforcing material which reinforces portions near the opening part 8Ba of the enclosure 8B.

Figure 14:
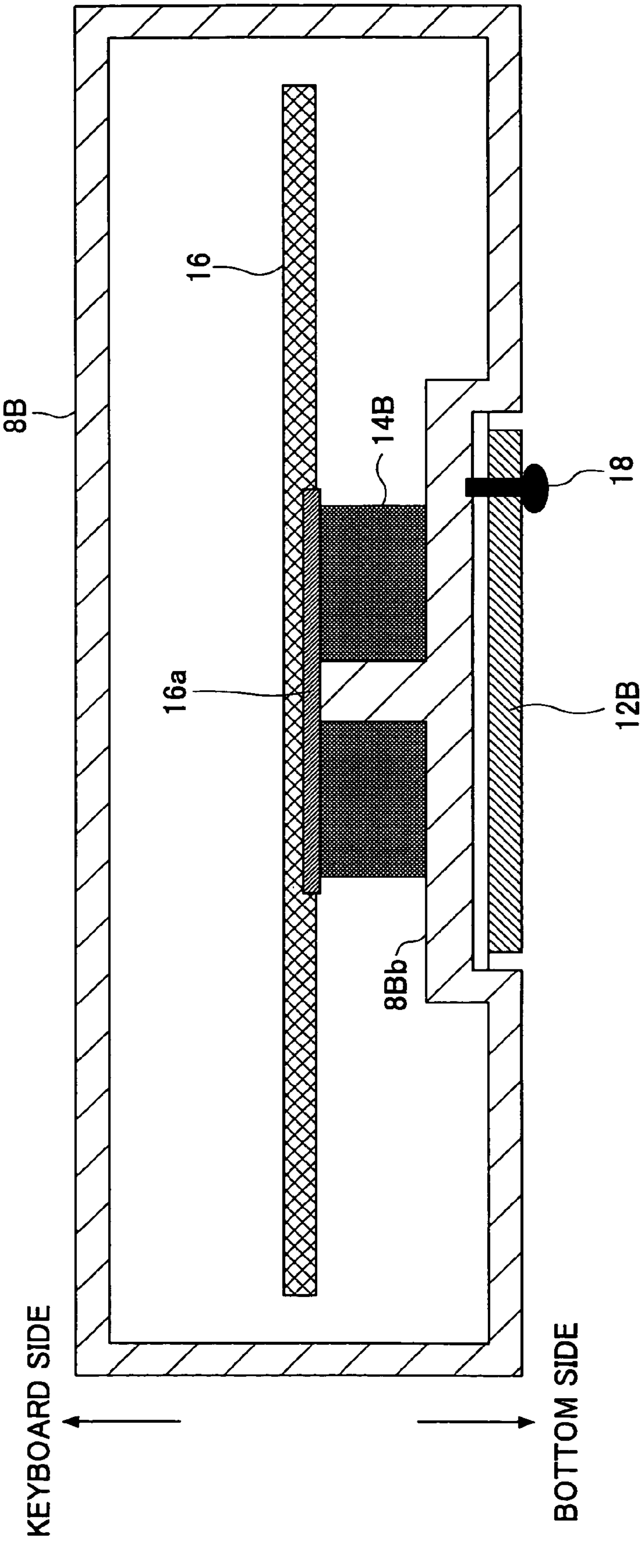
FIG. 14 is an illustrative cross-sectional view of the shield structure taken along an extending direction of a rib provided in the opening part.

As shown in FIG. 12, the rib 8Bb is formed so as to cross the center of the opening part 8Ba between the connectors 14A, 14B. As shown in FIG. 14, the rib 8Bb has a portion having a width (a distance extending inside the shield structure) that can be brought into contact with the signal ground line 16*a* of the printed circuit board 16. The rib 8Bb is applied with metal plating as electrically conductive plating, and a surface thereof is covered with metal. The metal plating of the rib 8Bb is connected to a ground portion (a metal-plated portion) of the enclosure 8B itself.

FIG. 14 is an illustrative cross-sectional view of the enclosure 8B taken along an extending direction of the rib 8Bb provided in the opening part 8Ba. The rib 8Bb is formed so as to cross the opening part 8Ba and extend between the connectors 14A, 14B. Although the entire rib 8Ba may be configured to extend to and brought into contact with the signal ground line 16*a* on the printed circuit board 16, only a central portion of the rib 8Bb extends and is brought into contact with the signal ground line 16*a*. As mentioned above, the rib 8Bb is applied with metal-plating, similar to the inner surface of the metal-plating of the enclosure 8B is connected to the metal-plating of the rib 8Bb. Thus, according to the present embodiment, the rib 8Ba serves as an electrical connection material.

When the central portion of the rib 8Bb is brought into contact with the signal ground line 16*a* on the printed circuit board 16, the enclosure ground potential of the enclosure 8B becomes equal to the signal ground potential of the printed circuit board 16 through the rib 8Bb. Thereby, when the lid 12B is attached to the opening part 8Ba of the enclosure 8B as shown in FIG. 13 and FIG. 14, the ground potential of the lid 12B, which is connected to the opening part 8Ba of the enclosure 8B, becomes equal to the signal ground potential, and, thus, all portions near the opening parts 8Ba can be at the signal ground potential.

As mentioned above, in the present embodiment, instead of protruding part 12Ab of the lid 12A in the above-mentioned first embodiment, the rib 8Bb is provided to the opening part 8Ba so as to set the lid 12B and peripheral portions thereof at the signal ground potential, which improves the shielding effect of electromagnetic waves in the opening part 8Ba. Thereby, the electromagnetic waves generated due to operations of the memory modules 10A, 10B is shielded, which effectively suppresses leakage of electromagnetic waves from the opening part 8Ba.

A description will now be given, with reference to FIG. 15 through FIG. 18, of a shield structure of a note PC according to a third embodiment of the present invention. In FIG. 15 through FIG. 18, parts that are the same as the parts in the above-mentioned first and second embodiments are given the same reference numerals.

Figure 15:
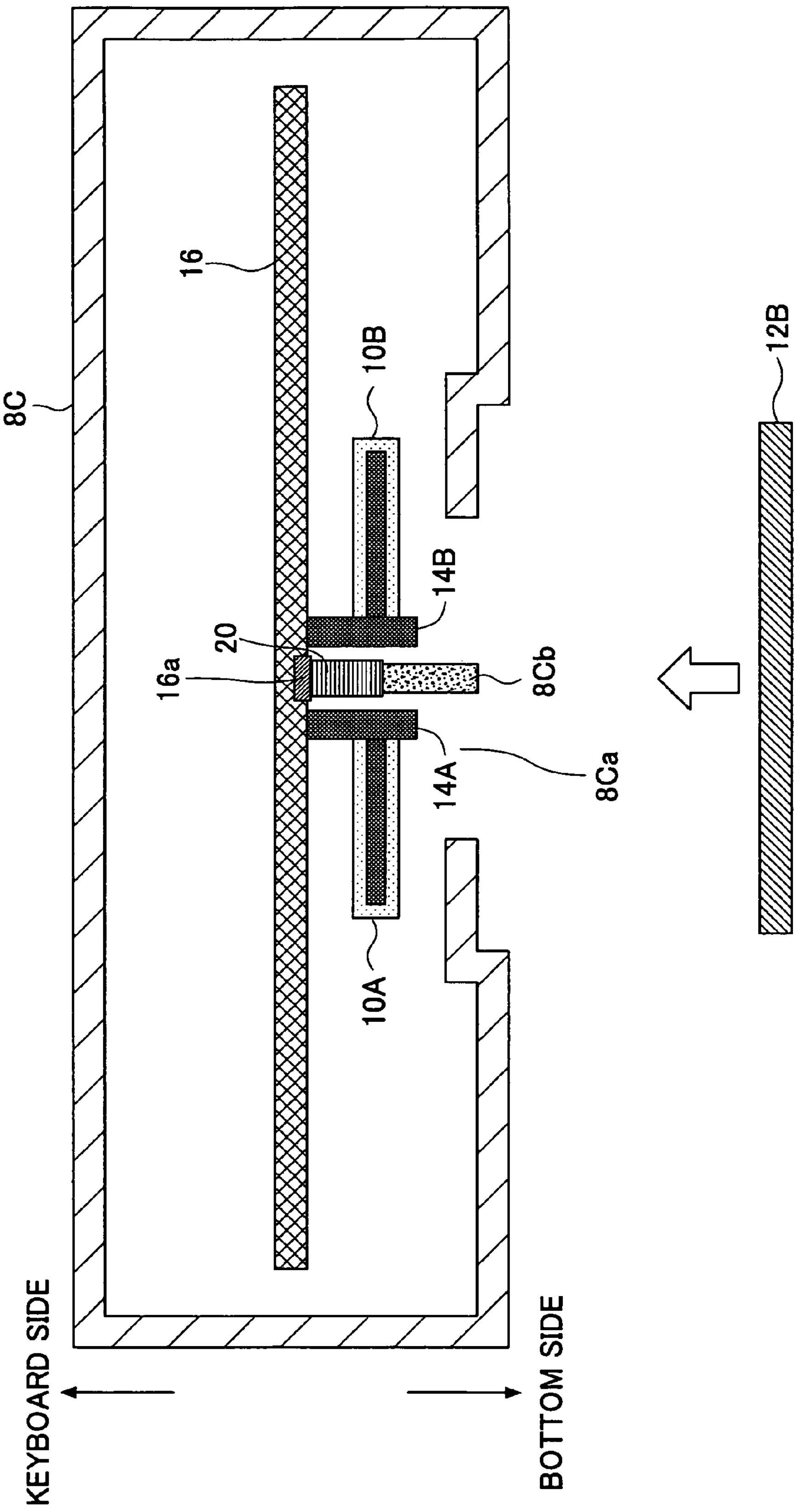
FIG. 15 is an illustrative cross-sectional view of a shield structure of a note PC according to a third embodiment of the present invention.
Figure 16:
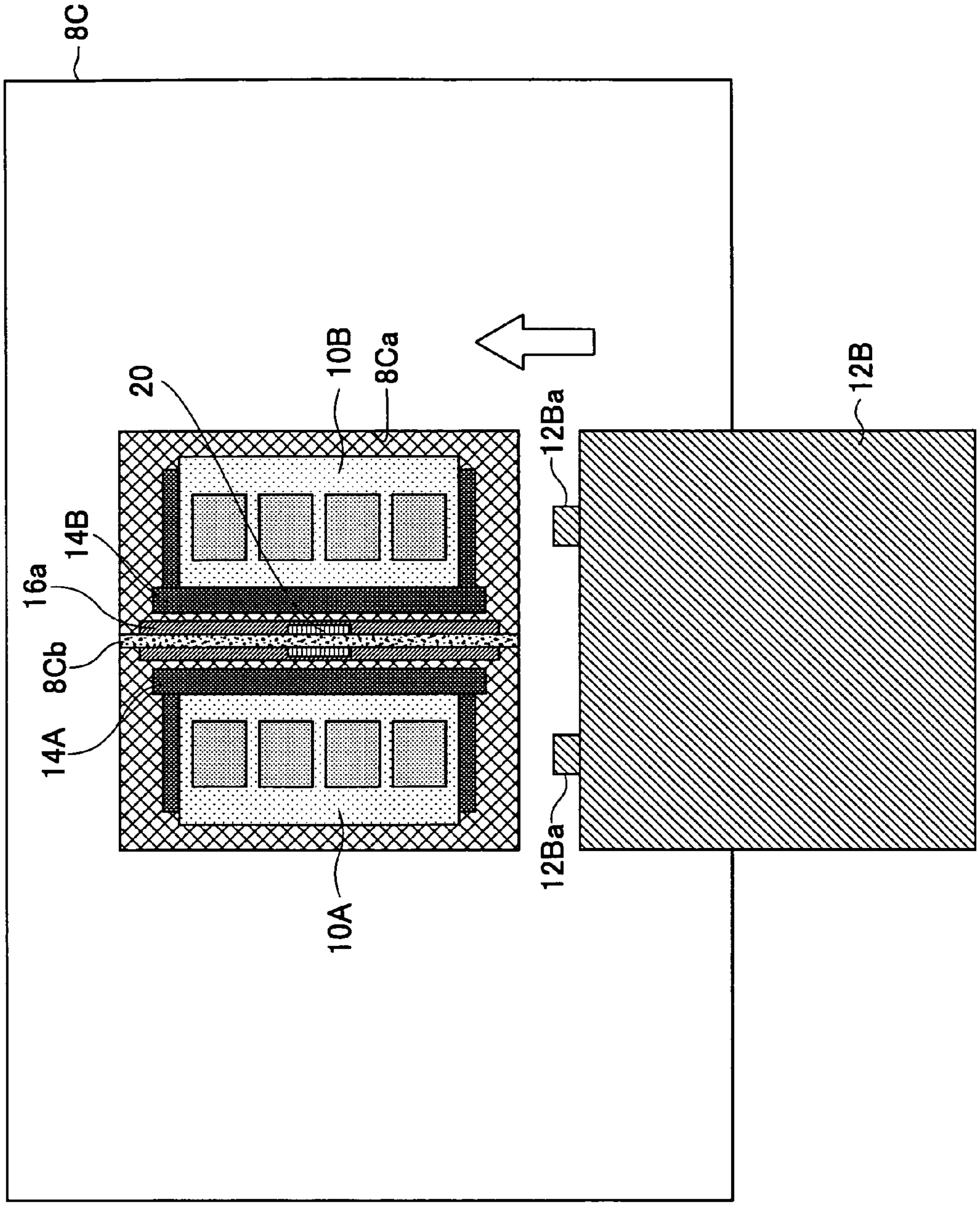
FIG. 16 is an illustrative plan view of the shield structure viewed from a bottom side.
Figure 17:
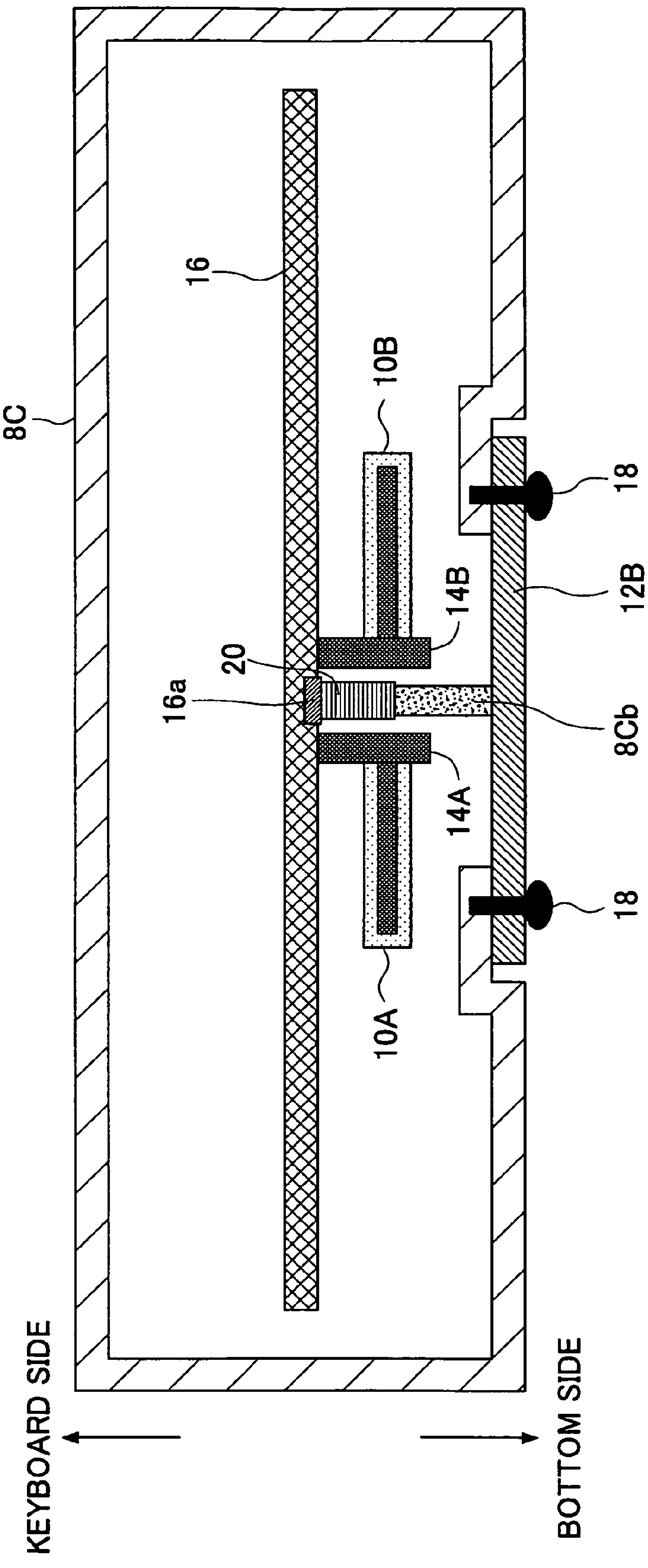
FIG. 17 is a cross-sectional view showing a state where a lid is attached to an opening part of the shield structure.
Figure 18:
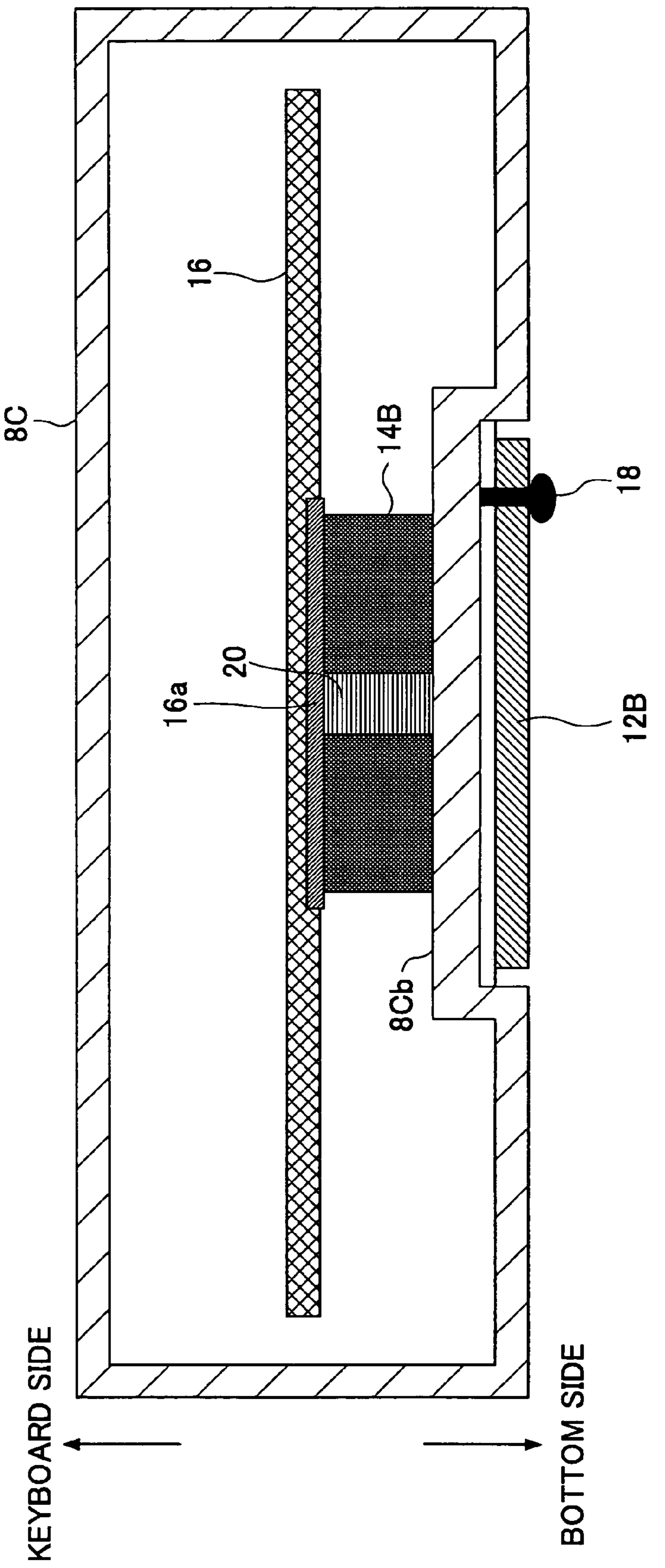
FIG. 18 is an illustrative cross-sectional view taken along an extending direction of a rib provided to the opening part.

FIG. 15 is an illustrative cross-sectional view of the enclosure 8C of the note PC according to the third embodiment of the present invention. FIG. 16 is an illustrative plan view of the enclosure 8C viewed from a bottom side, and a state where the lid 12B is removed is shown. FIG. 17 is a cross-sectional view showing a state where the lid 12B is attached to the opening part 8Ca of the enclosure 8C. FIG. 18 is an illustrative cross-sectional view taken along an extending direction of the rib 8Cb provided to the opening part 8Ca. In the present embodiment, similar to the above-mentioned second embodiment, as a part of the enclosure 8C, a rib 8Cb is provided in the center of the opening part 8Ca as a reinforcing material which reinforces portions near the opening part 8Ba of the enclosure 8C.

As shown in FIG. 16, the rib 8Cb is formed so as to cross the center of the opening part 8Ca between the connectors 14A, 14B. The rib 8Cb does not have a portion which is brought into contact with the signal ground line 16*a* of the printed circuit board 16 as shown in FIG. 15, but an electrically conductive gasket 20 is sandwiched between the extreme end of the rib 8Cb and the signal ground line 16*a*. The electrically conductive gasket 20 is a gasket made of an elastic material having conductivity or a gasket formed by an electrically conductive material provided with elasticity.

The rib 8Cb is applied with metal-plating as electrically conductive plating, and the surface thereof is covered with metal. The metal-plating of the rib 8Bc is connected to the ground portion (metal-plated portion inside the shield structure or the like) of the enclosure 8C itself, which is at the enclosure ground potential (FG). Accordingly, the rib 8Cb and the signal ground line 16*a* are electrically connected to each other through the electrically conductive gasket 20. As mentioned above, in the present invention, the rib 8Cb and the electrically conductive gasket serve as electric connection materials.

When the rib 8Cb is electrically connected to the signal ground line 16*a* on the printed circuit board 16 through the electrically conductive gasket 20, the enclosure ground potential of the enclosure 8C becomes equal to the signal ground potential of the printed circuit board 16 through the rib 8Cb. Thereby, when the lid 12B is attached to the opening part 8Cc of the enclosure 8C, the ground potential of the lid 12B connected to the enclosure 8C at the attaching portion is equal to the signal ground potential, which results in that all portions near the opening part 8Ca are at the signal ground potential.

As mentioned above, in the present embodiment, instead of the protruding part 12Ab of the lid 12A in the above-mentioned first embodiment, the rib 8Cb is provided to the opening part 8Ba and the gasket 20 is provided between the rib 8Cb and the signal ground line 16*a* so as to set the opening part 8Ca and the peripheral portions thereof to the signal ground potential, which improves a shielding effect of electromagnetic waves in the opening part 8Ca. Thereby, electromagnetic waves generated due to operations of the memory modules 10A, 10B are shielded, which effectively suppresses leakage of electromagnetic waves from the opening part 8Ca.

It should be noted that the above-mentioned electrically conductive gasket 20 is not limited to a gasket, and any elastic material having electric conductivity may be used. For example, instead of the electrically conductive gasket 20, an electrically conductive elastic material such as a spring material formed by bending a metal plate may be used. As such an electrically conductive elastic material, there is one referred to as a surface mount spring (SMT finger).

A description will now be given, with reference to FIG. 19 through FIG. 22, of a shield structure of a note PC according to a fourth embodiment of the present invention. In FIG. 19 through FIG. 22, parts that are the same as the parts in the above-mentioned first through third embodiments are given the same reference numerals.

Figure 19:
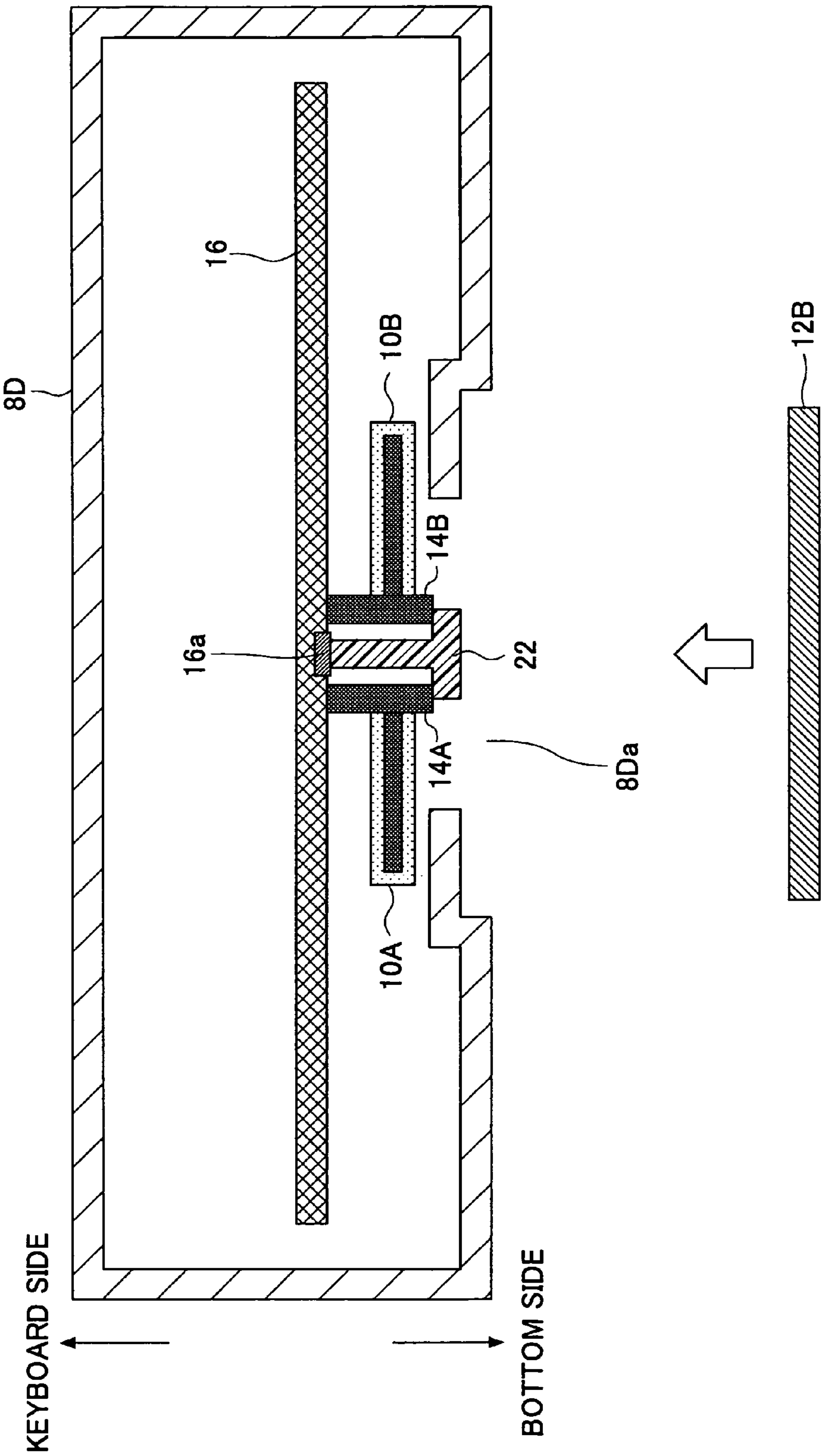
FIG. 19 is an illustrative cross-sectional view of a shield structure of a note PC according to a fourth embodiment of the present invention.
Figure 20:
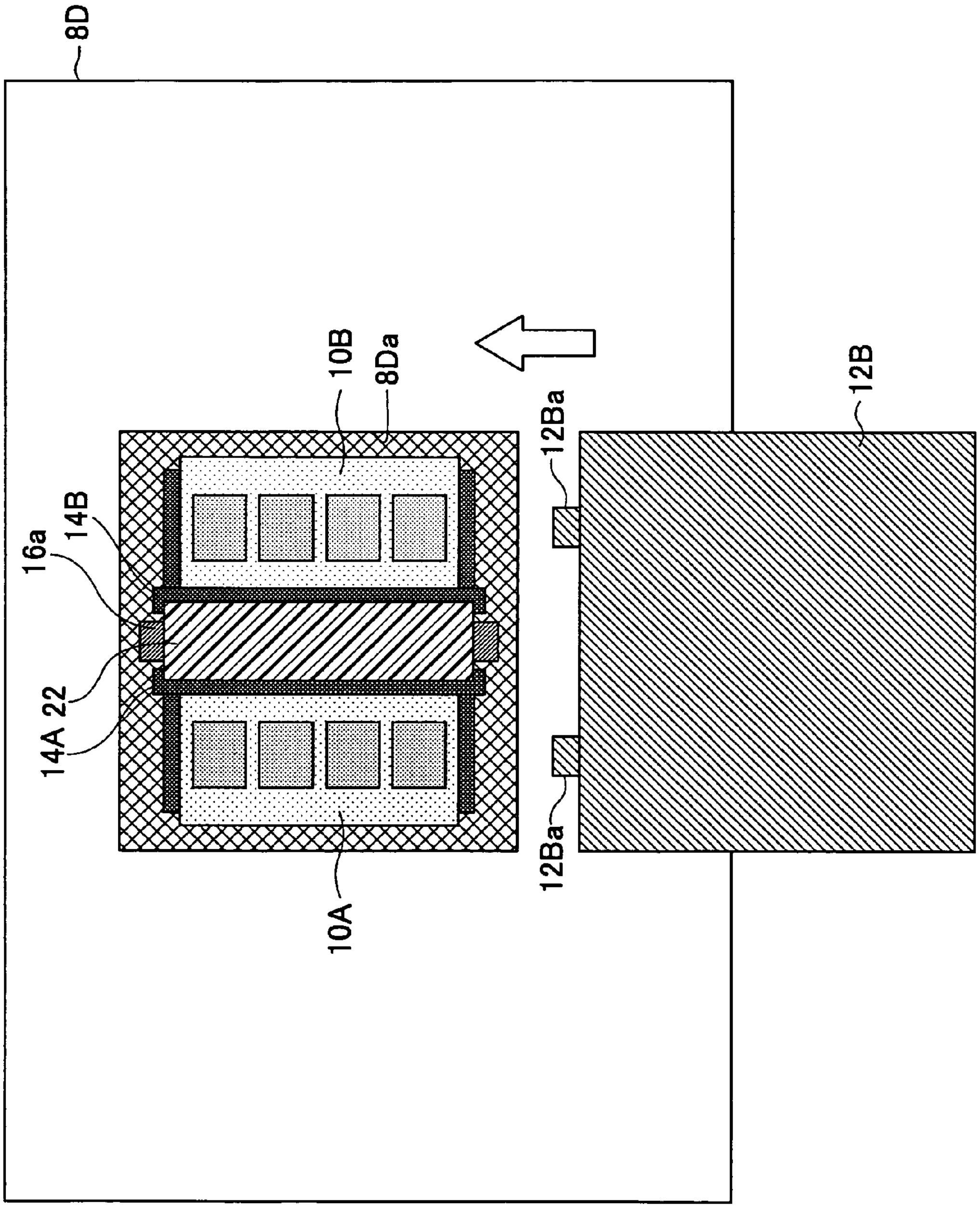
FIG. 20 is an illustrative plan view of the shield structure viewed from above.
Figure 21:
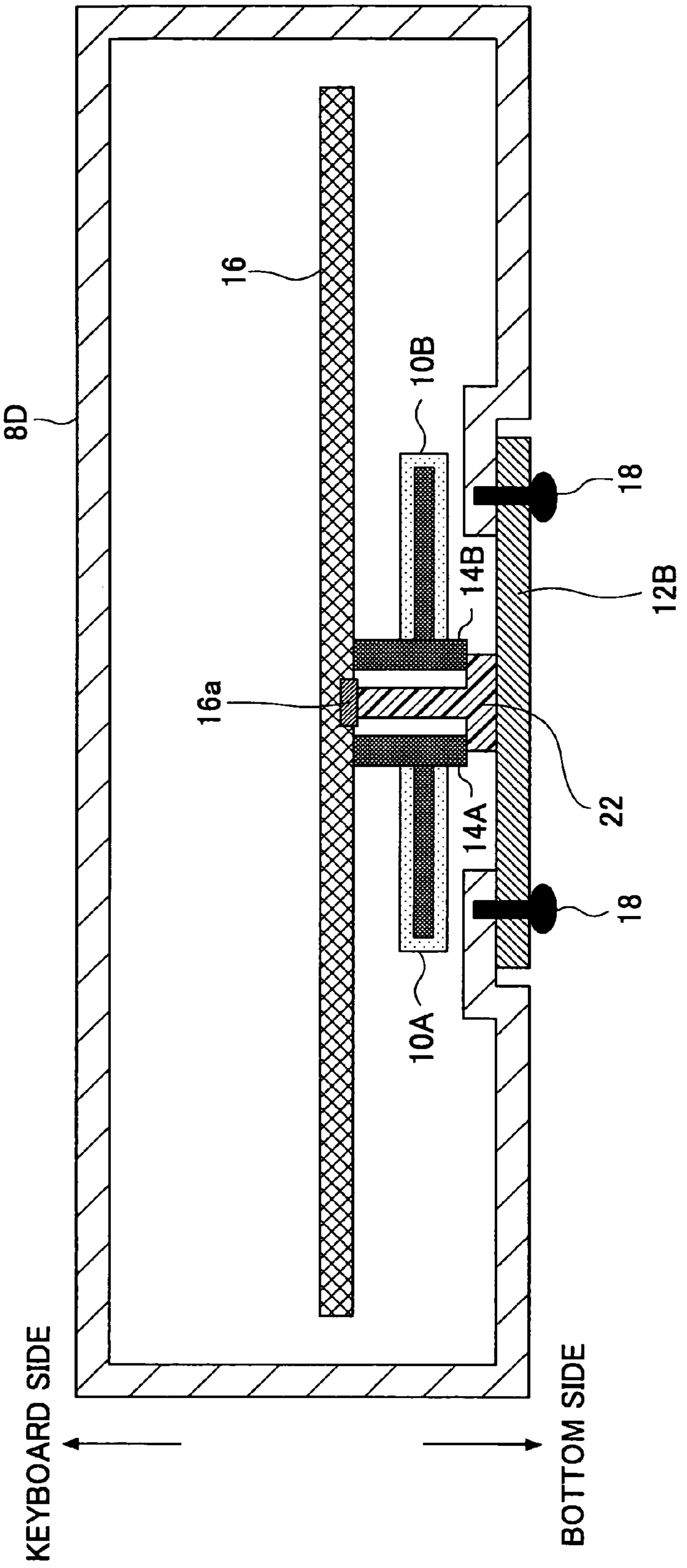
FIG. 21 is an illustrative cross-sectional view showing a state where a lid is attached to an opening part of the shield structure.
Figure 22:
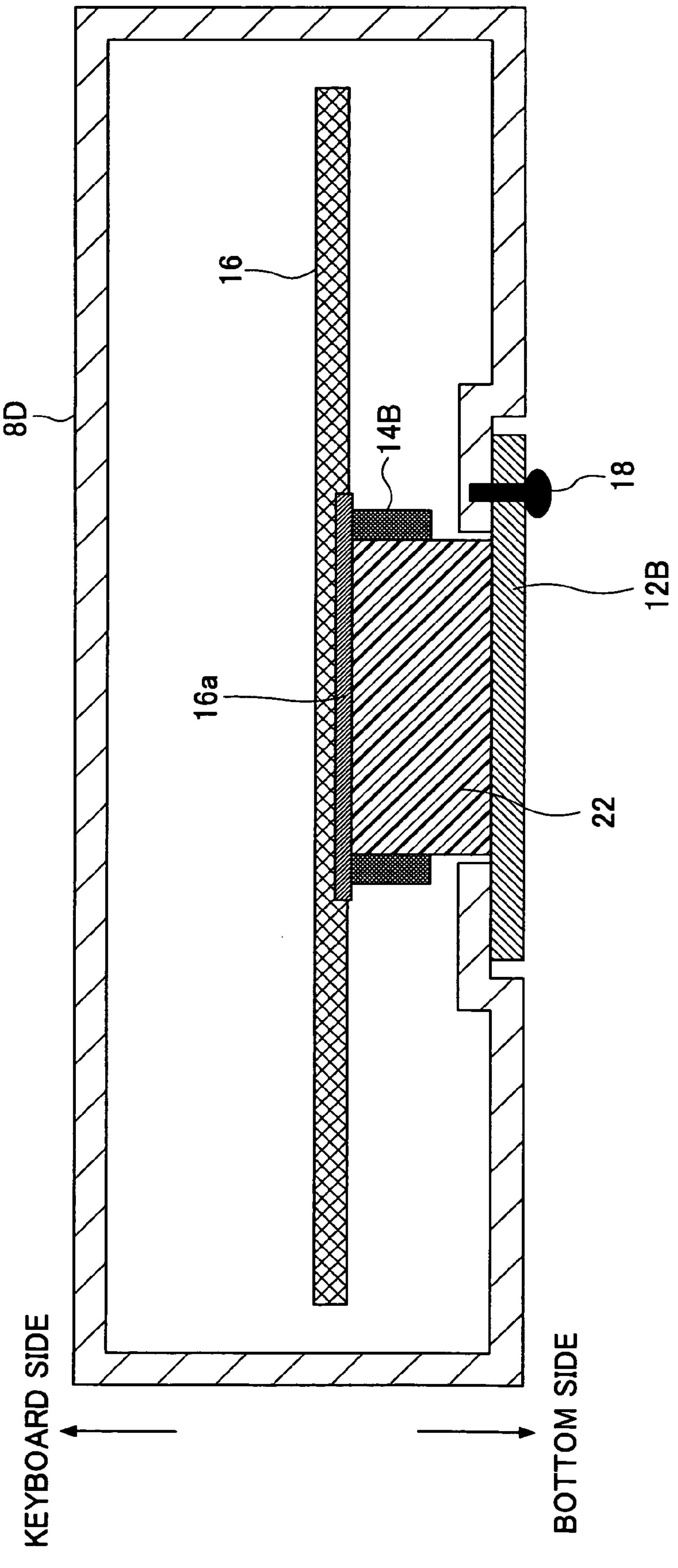
FIG. 22 is an illustrative cross-sectional view of the shield structure taken along an extending direction of an electrically conductive material provided between connectors.

FIG. 19 is an illustrative cross-sectional view of the shield structure 8D of the note PC according to the fourth embodiment of the present invention. FIG. 20 is an illustrative plan view of the enclosure 8D viewed from above, and a state where the lid 12B is removed is shown. FIG. 21 is an illustrative cross-sectional view showing a state where the lid 12B is attached to an opening part 8Da of the enclosure 8D. FIG. 22 is an illustrative cross-sectional view of the enclosure 8D taken along an extending direction of an electrically conductive material provided between the connectors. In the present embodiment, the electrically conductive material 22 serves as an electric connection material.

The electrically conductive material 22 may be any material having a surface providing electric conductivity, such as a plate-like material formed of metal or a plate-like material having a surface applied with metal-plating or metal-coating as electrically conductive plating. That is, the electrically conductive material 22 is located between the lid 12B and the signal ground line 16*a* on the printed circuit board 16, when the lid 12B is attached to the opening part 8Da, so as to electrically connect therebetween. It is preferable that the electrically conductive material 22 is elastically deformable by being pressed by the lid 12B, when the lid 12B is attached to the opening part 8Da, so that the electrically conductive material 22 can intimately contact with the lid 12B and the printed circuit board 16.

As mentioned above, in the present embodiment, instead of the protruding part 12Ab of the lid 12A in the above-mentioned first embodiment, the electrically conductive material 22 is provided between the lid 12B and the signal ground line 16*a* so as to set the lid 12B and peripheral portions at the signal ground potential, which improves a shielding effect of electromagnetic waves in the opening part 8Da. Thereby, electromagnetic waves generated due to operations of the memory modules 10A, 10B are shielded, which effectively suppresses leakage of electromagnetic waves from the opening part 8Da.

In each of the above-mentioned embodiments, although it is preferable that the signal ground line 16*a* provided on the printed circuit board 16 is formed when forming the printed circuit board 16, the signal ground line 16*a* may be separately provided after the printed circuit board 16 is formed. For example, an insulating film such as Kapton tape (registered trademark) is applied onto a signal wiring formed on the printed circuit board 16 between the connectors 14A, 14B, and an electrically conductive material such as a copper tape is applied thereon and connect the electrically conductive material to a ground potential portion of the printed circuit board 16. Thus, the signal ground line 16*a* can be formed later on the already fabricated printed circuit board 16.

As mentioned above, by forming the signal ground line 16*a* later and by attaching the electric connection material which electrically connect the signal ground line 16*a* and the backside of the lid of the memory opening part to each other, a shielding effect of a shield structure of information technology equipments such as a note PC, which has been manufactured, can be improved.

Here, a description will be given of results of measurements of noise levels using a shield structure having an improved shielding effect based on the above-mentioned embodiments.

The measurements of noise (interference wave) were performed using a shield structure in which a copper sheet is applied onto a signal wiring for memory on a printed circuit board of an existing note PC via an insulating film and an electrically conductive gasket is interposed between the copper sheet and a rib provided to an opening of a shield structure. It should be noted that the note PC used for the measurements was a single module insertion type.

Figure 23:
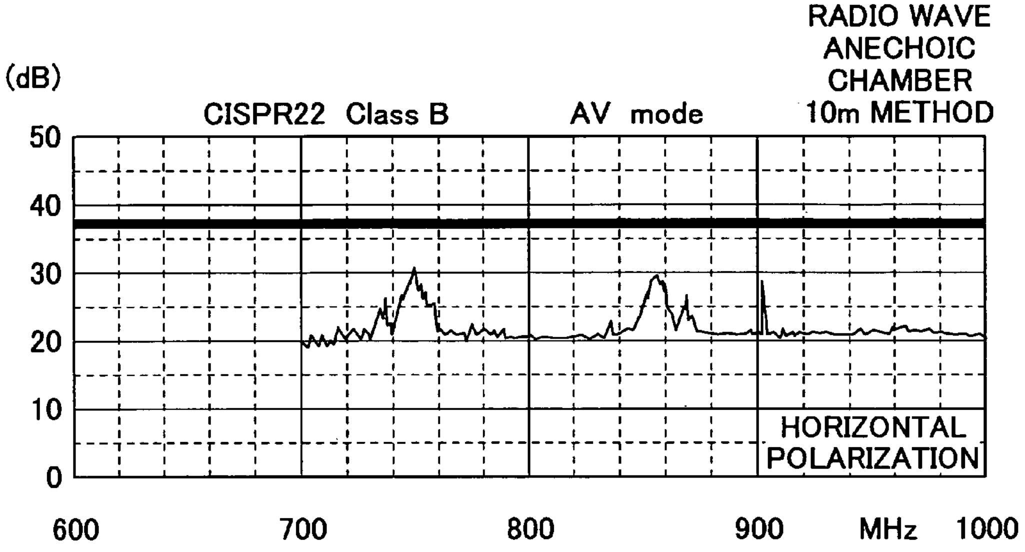
FIG. 23 is a graph showing results of measurements of interference waves for an existing note PC.
Figure 23:
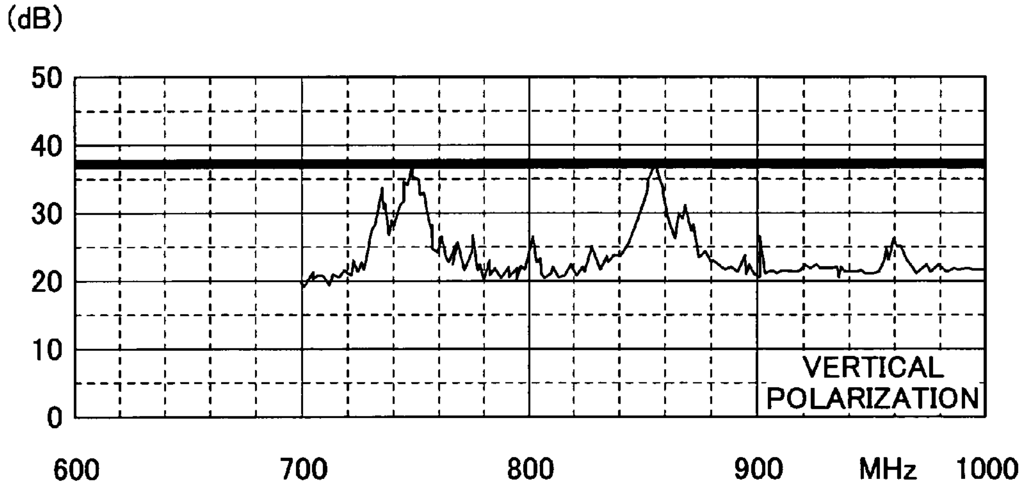

Based on the measuring method of the international standard CISPR22, the note PC was placed in a radio wave anechoic chamber and operated, and electromagnetic waves were measured at a distance of 10 meters. For comparison, first, a horizontal polarization and a vertical polarization of the electromagnetic waves were measured without making the structure providing the above-mentioned shielding effect. FIG. 23 is a graph showing the results of the measurements. A bold line in the graph indicates an allowable limit for a class B device of CISPR22. It can be appreciated from FIG. 23 that the note PC having no countermeasures of improving a shielding effect cleared the allowable limit with a large margin with respect to the horizontal polarization, but the level of the vertical polarization was very close to the allowable limit.

Figure 24:
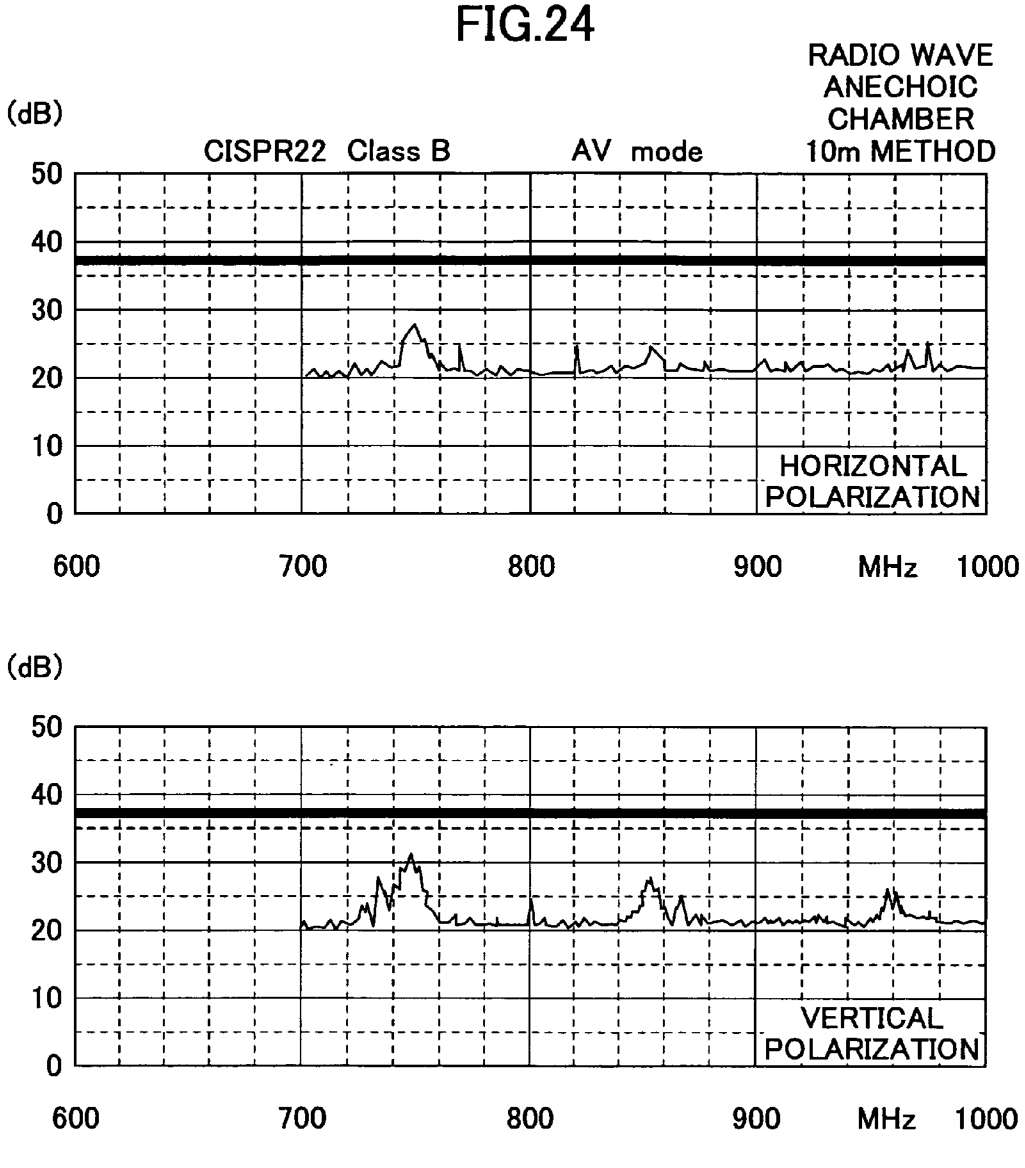
FIG. 24 is a graph showing results of measurements of interference waves for a note PC taking shielding effect improving countermeasures according to the present invention.

Then, measurements were taken by the same conditions with the note PC having the above-mentioned improved shielding effect. FIG. 24 is a graph showing the results of measurements. Comparing FIG. 24 and FIG. 23, it can be appreciated that the vertical polarization, which was close to the allowable limit before taking the shielding effect improving countermeasures, cleared the allowable limit with a considerable margin after taking the shielding effect improving countermeasures. Additionally, a reduction in the level was observed also in the horizontal polarization.

As mentioned above, it was found that the existing models can be made to satisfy the CISPR22 standard by taking the shielding effect improving countermeasures according to the present invention. Moreover, it can be assumed that the requirements by the standard can be satisfied sufficiently by taking the shielding effect improving countermeasures according to the present invention even if a clock frequency of CPUs is increased further.

The present invention is not limited to the above-mentioned embodiments, and variations and modifications may be made without departing from the scope of the present invention.

The present invention is based on Japanese priority application No. 2006-044345 filed Feb. 21, 2006, the entire contents of which are hereby incorporated herein by reference.

What is claimed is:

1. A shield structure for information technology equipments, comprising:

a signal ground line provided on a printed circuit board accommodated in an enclosure for information technology equipments;

an opening part provided in a portion of said shield structure for information technology equipments;

a lid covering the opening part;

an electric connection material extending between said lid and said signal ground line of said printed circuit board and having at least a surface formed by an electrically conductive material; and two connectors mounted on said printed circuit board close to each other so that two memory modules are connectable to the connectors, respectively, wherein said electric connection material is in contact with said signal ground line of said printed circuit board, said opening part is provided at a position corresponding to a position where said memory modules are connected to said two connectors, and said signal around line is provided between said two connectors and extends longer than a length of said memory modules, and a width of said electric connection material, which has a plate-like shape and extends from said lid, is equal to a length of said signal ground line.

2. The shield structure for information technology equipments as claimed in claim 1, wherein at least one protruding tab is formed on one side of said lid so as to be inserted into an engaging part of said shield structure for information technology equipments, said electric connection material extends in a direction of insertion of said protruding tab, and said connectors on said printed circuit board extend in the direction of insertion.

3. The shield structure for information technology equipments as claimed in claim 1, wherein said electric connection material is a protruding part protruding on a backside of said lid and having at least a surface formed of an electrically conductive material.

4. The shield structure for information technology equipments as claimed in claim 3, wherein said lid has a structure in which a metal plate is applied to an entire backside including said protruding part.

5. The shield structure for information technology equipments as claimed in claim 3, wherein said lid has a structure in which conductive plating is applied onto an entire backside including said protruding part.

6. The shield structure for information technology equipments as claimed in claim 3, wherein only a part of said protruding part of said lid is in contact with said signal ground line.

7. The shield structure for information technology equipments as claimed in claim 1, wherein said electric connection material is a reinforcing material crossing said opening part of said shield structure for information technology equipments and having at least a surface formed of an electrically conductive material.

8. The shield structure for information technology equipments as claimed in claim 7, wherein said reinforcing material extends between said two connectors, and one end of said reinforcing material is in contact with said signal ground line on said printed circuit board.

9. The shield structure for information technology equipments as claimed in claim 8, wherein only a part of said reinforcing material is in contact with said signal ground line.

10. The shield structure for information technology equipments as claimed in claim 7, wherein said reinforcing material extends between said two connectors, and an electrically conductive elastic material is provided between said reinforcing material and said signal ground line on said printed circuit board.

11. The shield structure for information technology equipments as claimed in claim 10, wherein said electrically conductive elastic material is an electrically conductive gasket.

12. The shield structure for information technology equipments as claimed in claim 10, wherein said electrically conductive elastic material is a surface mount spring.

13. The shield structure for information technology equipments as claimed in claim 1, wherein said electric connection material is an electrically conductive material arranged between said two connectors and having at least a surface formed of an electrically conductive material, and opposite ends of said electric connection material are in contact with a backside of said lid and said signal ground line, respectively.

14. The shield structure for information technology equipments as claimed in claim 13, wherein said electrically conductive material is elastically deformable between said lid and said signal ground line.

15. The shield structure for information technology equipments as claimed in claim 1, wherein said signal ground line is an electrically conductive sheet material applied on an insulation film applied on said signal wiring formed on said printed circuit board between said two connectors, and the electrically conductive sheet material is electrically connected to a ground potential portion of said printed circuit board.

16. The shield structure for information technology equipments as claimed in claim 15, wherein said electrically conductive sheet material is a copper sheet.

* * * * *